(12) United States Patent
Ikriannikov et al.

(10) Patent No.: US 12,198,844 B2
(45) Date of Patent: Jan. 14, 2025

(54) INDUCTORS INCLUDING ELECTRICALLY CONDUCTIVE STANDOFFS

(71) Applicant: Maxim Integrated Products, Inc., San Jose, CA (US)

(72) Inventors: Alexandr Ikriannikov, San Jose, CA (US); Andrea Pizzutelli, Redwood City, CA (US); Thurein Soe Paing, San Jose, CA (US); Di Yao, San Jose, CA (US)

(73) Assignee: Maxim Integrated Products, Inc., San Jose, CA (US)

( * ) Notice: Subject to any disclaimer, the term of this patent is extended or adjusted under 35 U.S.C. 154(b) by 942 days.

(21) Appl. No.: 17/233,512

(22) Filed: Apr. 18, 2021

(65) Prior Publication Data

US 2021/0391113 A1    Dec. 16, 2021

Related U.S. Application Data

(60) Provisional application No. 63/038,106, filed on Jun. 11, 2020.

(51) Int. Cl.
*H01F 27/28* (2006.01)
*H01F 27/06* (2006.01)
*H01F 27/24* (2006.01)
*H05K 1/14* (2006.01)

(52) U.S. Cl.
CPC ............. *H01F 27/28* (2013.01); *H01F 27/06* (2013.01); *H01F 27/24* (2013.01); *H05K 1/145* (2013.01); *H01F 2027/065* (2013.01); *H05K 2201/1003* (2013.01); *H05K 2201/10568* (2013.01)

(58) Field of Classification Search
CPC .......... H01F 27/28; H01F 27/06; H01F 27/24; H01F 2027/065; H05K 1/145; H05K 2201/1003; H05K 2201/10568
See application file for complete search history.

(56) References Cited

U.S. PATENT DOCUMENTS

| | | | |
|---|---|---|---|
| 8,350,658 B1 * | 1/2013 | Stratakos | H01F 17/06 336/212 |
| 8,498,124 B1 | 7/2013 | Folker et al. | |
| 9,281,739 B2 | 3/2016 | Ikriannikov et al. | |
| 9,293,246 B1 | 3/2016 | Folker et al. | |
| 9,336,941 B1 * | 5/2016 | Ikriannikov | H01F 27/29 |
| 9,721,719 B1 * | 8/2017 | Ikriannikov | H01F 27/263 |
| 9,805,859 B1 | 10/2017 | Berry et al. | |

(Continued)

*Primary Examiner* — Malcolm Barnes
(74) *Attorney, Agent, or Firm* — PdZ Patent Law, PLLC

(57) ABSTRACT

An inductor includes a magnetic core, a first winding, a first electrically conductive standoff, and a second electrically conductive standoff. The magnetic core includes opposing first and second outer surfaces separated from each other in a first direction. The first winding has first and second ends, and the first winding is wound around at least a portion of the magnetic core. The first electrically conductive standoff is connected to the first end of the first winding, and the first electrically conductive standoff extends along the magnetic core in the first direction from the first outer surface to the second outer surface. The second electrically conductive standoff is connected to the second end of the first winding, and the second electrically conductive standoff extends along the magnetic core in the first direction from the first outer surface to the second outer surface.

11 Claims, 18 Drawing Sheets

(56) References Cited

U.S. PATENT DOCUMENTS

| | | | |
|---|---|---|---|
| 9,978,496 | B1 | 5/2018 | Folker et al. |
| 10,083,790 | B1 | 9/2018 | Folker |
| 11,049,646 | B2* | 6/2021 | Iizuka .................... H03H 7/427 |
| 2005/0128039 | A1 | 6/2005 | Weng |
| 2009/0059546 | A1 | 3/2009 | King |
| 2009/0179723 | A1* | 7/2009 | Ikriannikov ............ H01F 17/06 |
| | | | 336/200 |
| 2011/0043317 | A1* | 2/2011 | Ikriannikov .......... H01F 27/292 |
| | | | 336/192 |
| 2011/0148560 | A1* | 6/2011 | Ikriannikov .......... H01F 27/306 |
| | | | 336/192 |
| 2012/0056703 | A1* | 3/2012 | Ikriannikov .......... H01F 27/292 |
| | | | 336/188 |
| 2015/0235754 | A1* | 8/2015 | Ikriannikov .......... H01F 27/263 |
| | | | 336/212 |
| 2017/0047155 | A1* | 2/2017 | Yao ........................... H01F 3/10 |
| 2017/0309382 | A1* | 10/2017 | Ikriannikov ............. H01F 3/12 |
| 2018/0122562 | A1* | 5/2018 | Ji ......................... H01F 27/2847 |
| 2020/0219647 | A1* | 7/2020 | Ji ............................. H01F 3/08 |

\* cited by examiner

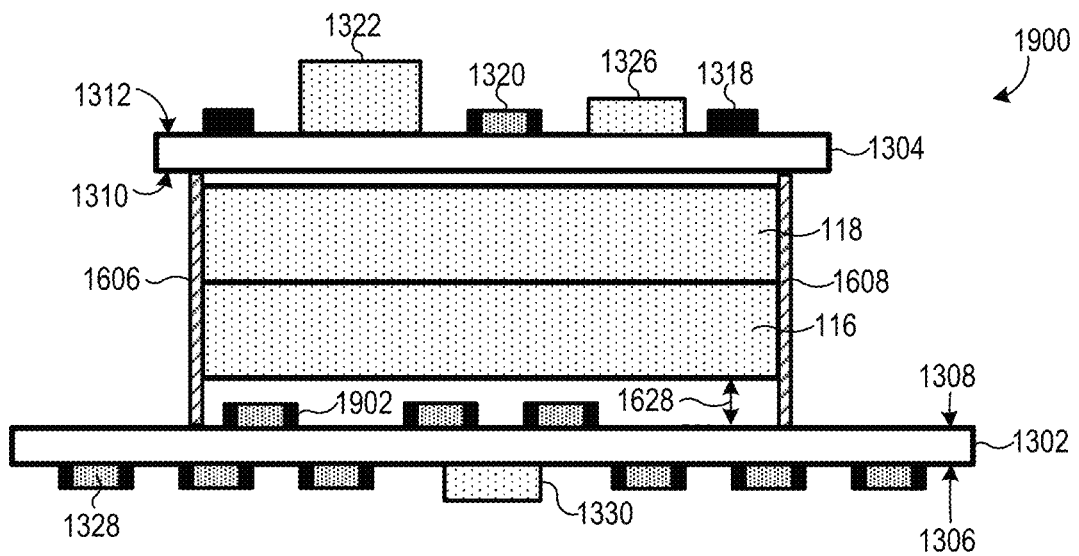
FIG. 19
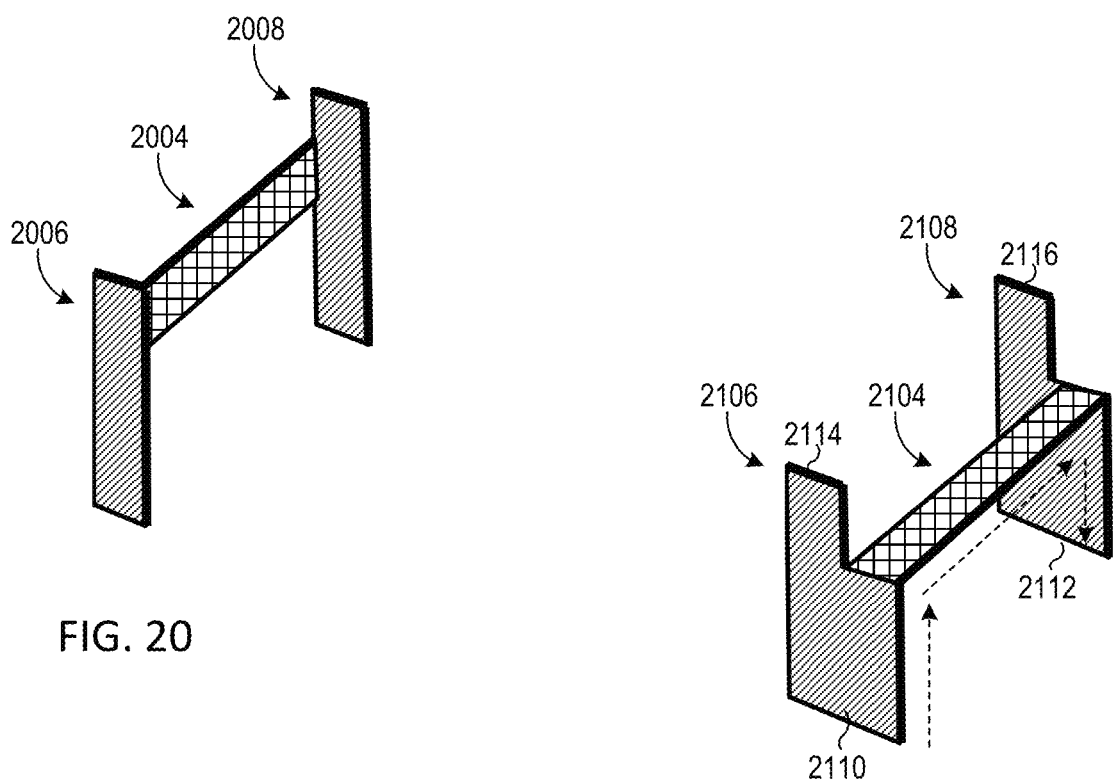
FIG. 20
FIG. 21

INDUCTORS INCLUDING ELECTRICALLY CONDUCTIVE STANDOFFS

RELATED APPLICATIONS

This application claims benefit of priority to U.S. Provisional Patent Application Ser. No. 63/038,106, filed on Jun. 11, 2020, which is incorporated herein by reference.

BACKGROUND

Inductors are used in a variety of applications. For example, inductors are commonly used in switching power converters to store energy, and inductors are also often used in small signal electrical circuits to filter signals. An inductor typically includes a magnetic core, such as formed of a ferrite magnetic material, and one or more windings wound around at least a portion of the magnetic core. An inductor with multiple windings may be a coupled inductor, where each winding is associated with a respective inductor and there is magnetic coupling among the inductors.

BRIEF DESCRIPTION OF THE DRAWINGS

FIG. 19 is a front elevational view of an alternate embodiment of the FIG. 13 circuit assembly.

FIG. 20 is a perspective view of an alternate embodiment of a winding and electrically conductive standoffs of the FIG. 1 inductor.

FIG. 21 is a perspective view of another alternate embodiment of a winding and electrically conductive standoffs of the FIG. 1 inductor.

DETAILED DESCRIPTION OF THE EMBODIMENTS

There is significant interest in increasing density of power conversion circuitry, especially in applications where space is at a premium. Inductors often have the largest height of all power conversion circuitry components, and inductors are therefore often the gating item when designing low-profile power conversion circuitry. Large inductor height results, in part, from need to have a sufficiently large magnetic core to achieve requisite energy storage and to prevent undesired magnetic saturation.

Inductors that are capable of being sandwiched between substrates, e.g. printed circuit boards (PCBs), have been developed. While these inductors can increase power conversion circuitry density, these inductors are unfortunately prone to failure when significant mechanical force is applied to the inductors, such from a heatsink assembly attached to one of the substrates. In particular, the inductors typically include a magnetic core, which is formed of a ferrite magnetic material to realize high magnetic permeability in a small volume, and the ferrite magnetic material is prone to cracking when subjected to mechanical force.

Disclosed herein are inductors which at least partially overcome the above-discussed problems. The new inductors include electrically conductive standoffs, which extend along magnetic core sides between opposing outer surfaces. The electrically conductive standoffs, for example, mechanically connect opposing substrates, thereby transferring mechanical force between the substrates while isolating a magnetic core of the inductor from the mechanical force. Consequently, the electrically standoffs advantageously enable the inductor to be sandwiched between substrates to promote high density, while protecting the inductor's magnetic cores from mechanical force and associated cracking. Additionally, in some embodiments, the electrically conductive standoffs electrically couple opposing substrates, and/or electrically couple the inductor to one or more of the substrates. Furthermore, the electrically conductive standoffs may facilitate removal of heat from a substrate.

Figure 1:
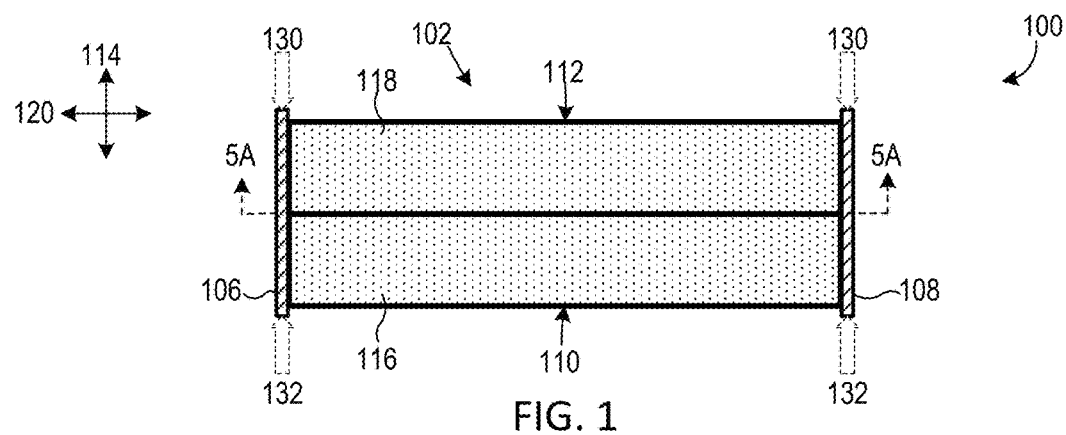
FIG. 1 is a front side elevational view of an inductor including electrically conductive standoffs, according to an embodiment.
Figure 2:
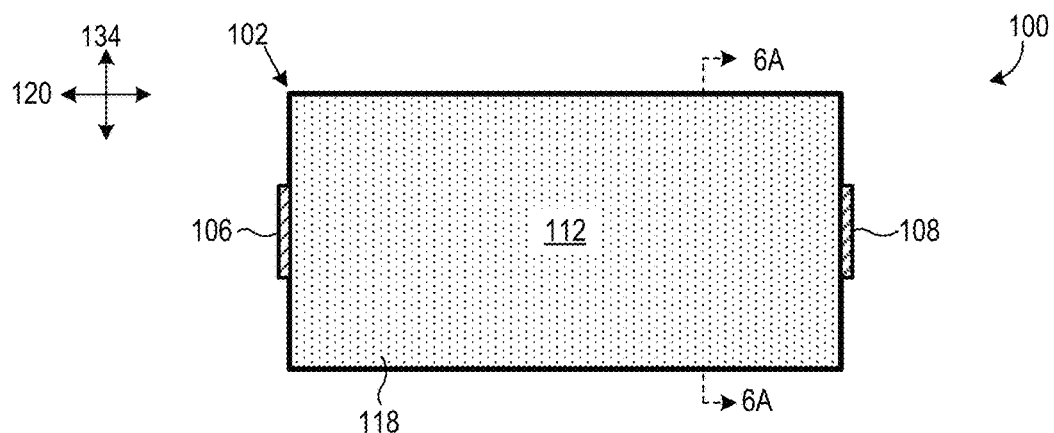
FIG. 2 is a top plan view of the FIG. 1 inductor.
Figure 3:
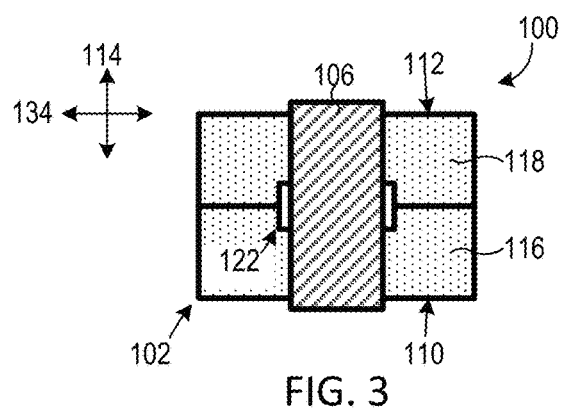
FIG. 3 is a left side elevational view of the FIG. 1 inductor.
Figure 4:
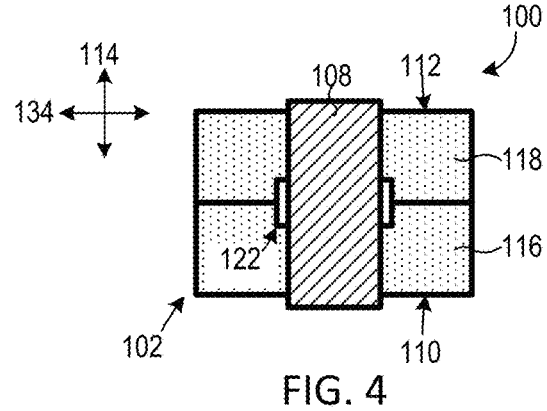
FIG. 4 is a right side elevational view of the FIG. 1 inductor.
Figure 5:
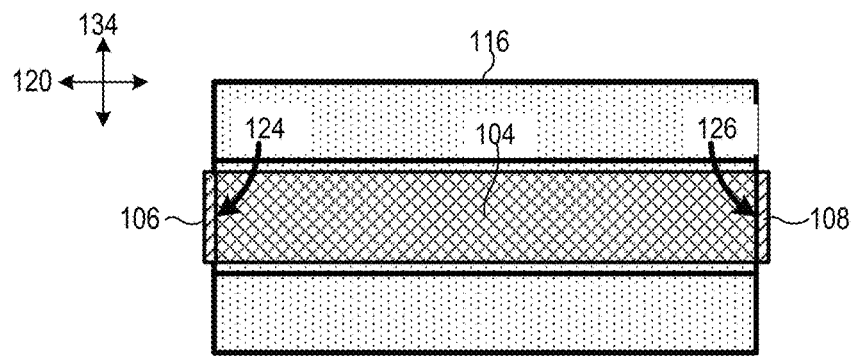
FIG. 5 is a cross-sectional view of the FIG. 1 inductor taken along line 5A-5A of FIG. 1.
Figure 6:
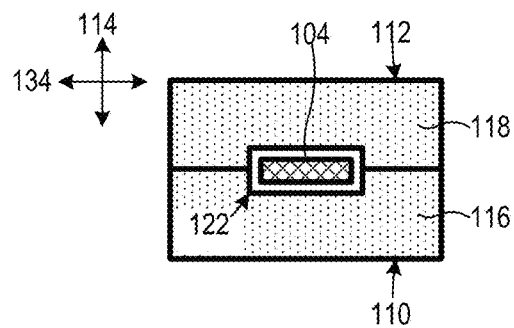
FIG. 6 is a cross-sectional view of the FIG. 1 inductor taken along line 6A-6A of FIG. 2.
Figure 7:
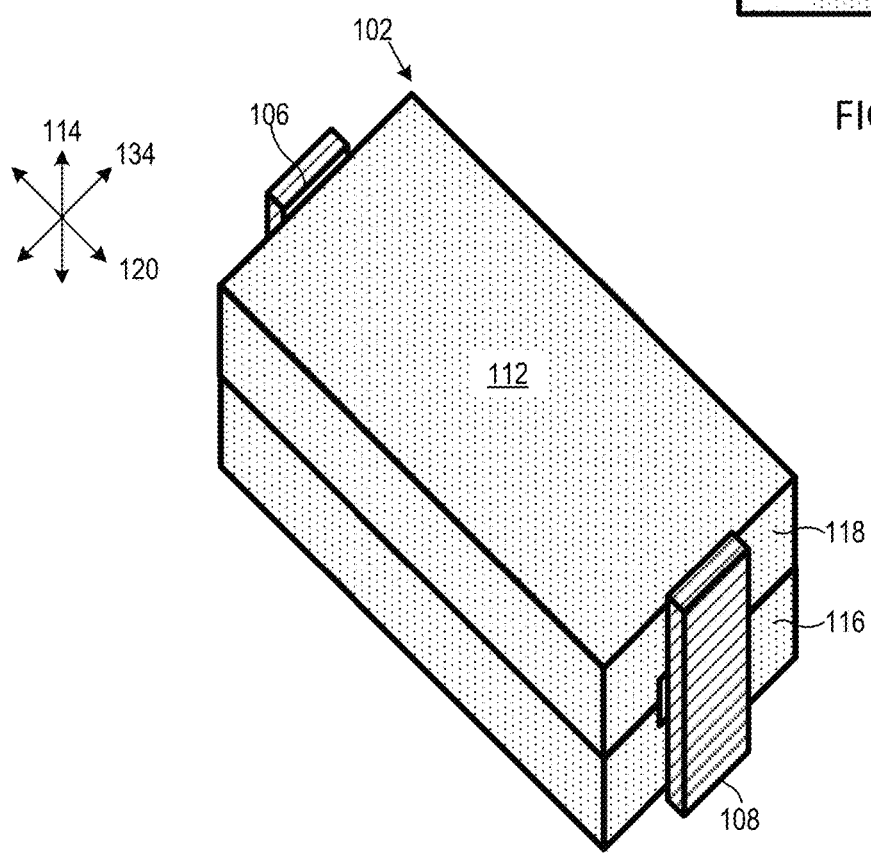
FIG. 7 is a perspective view of the FIG. 1 inductor.
Figure 8:
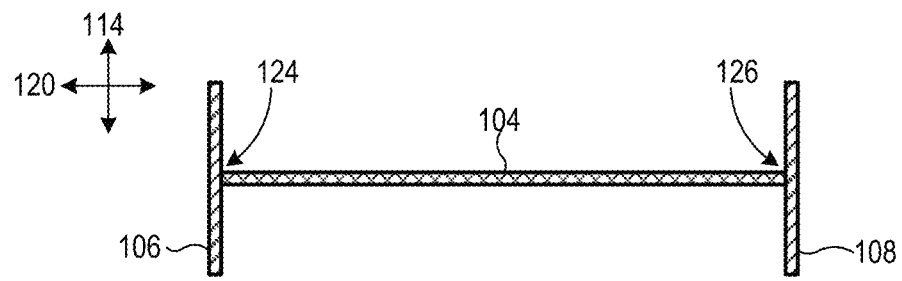
FIG. 8 is a front elevational view of the FIG. 1 inductor without a magnetic core.

FIGS. 1-7 illustrate an inductor 100, which is one embodiment of the new inductors including electrically conductive standoffs. FIG. 1 is a front side elevational view of inductor 100, and FIG. 2 is a top plan view of inductor 100. FIG. 3 is a left side elevational view of inductor 100, and FIG. 4 is a right side elevational view of inductor 100. FIG. 5 is a cross-sectional view of inductor 100 taken along line 5A-5A of FIG. 1, and FIG. 6 is a cross-sectional view of inductor 100 taken along line 6A-6A of FIG. 2. FIG. 7 is a perspective view of inductor 100. Inductor 100 includes a magnetic core 102, a first winding 104, a first electrically conductive standoff 106, and a second electrically conductive standoff 108. FIG. 8 is a front side elevational view of inductor 100 without magnetic core 102, and FIG. 9 is a perspective view of inductor 100 without magnetic core 102, to better show winding 104, first electrically conductive standoff 106, and second electrically conductive standoff 108.

Magnetic core 102 includes a first outer surface 110 and an opposing second outer surface 112 separated from each other in a direction 114. Magnetic core 102 is formed, for example, of a ferrite magnetic material. Magnetic core 102 includes a first portion 116 and a second portion 118 stacked on each other in a direction 114. In some embodiments, there is gap between first portion 116 and a second portion 118, such to help prevent magnetic saturation of magnetic core 102. The gap includes, for example, air, plastic, paper, or a magnetic material having a lower magnetic permeability than first and second portions 116 and 118. In the illustrated embodiments, each of first portion 116 and second portion 118 has a U-shape, as seen when viewed in a direction 120 that is orthogonal to direction 114, such that magnetic core 102 forms a channel 122 (FIGS. 3, 4, and 6) extending in direction 120. However, one or more first and second portions 116 and 118 could have other shapes without departing from the scope hereof. For example, first portion 116 could alternately have an I-shape while second portion 118 has a U-shape. Additionally, magnetic core 102 could be formed of additional portions or fewer portions without departing from the scope hereof. For example, in an alternate embodiment, magnetic core 102 is a single-piece monolithic block core, and in another alternate embodiment, magnetic core 102 includes three portions (not shown).

Figure 9:
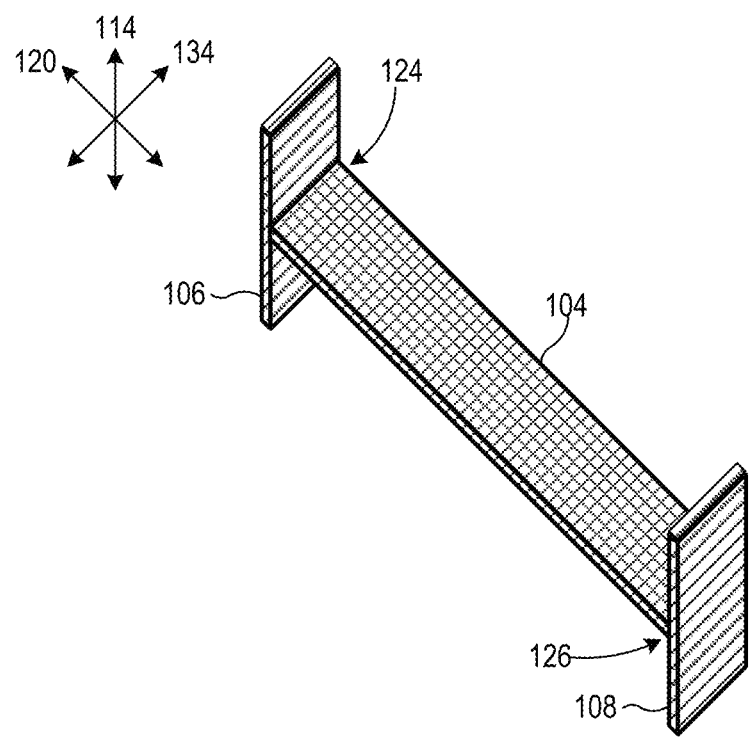
FIG. 9 is a perspective view of the FIG. 1 inductor without a magnetic core.

First winding 104 is wound partially around first portion 116 of magnetic core 102 (FIG. 5), and first winding 104 has opposing ends 124 and 126 separated from each other in direction 120 (FIGS. 5, 8, and 9). First electrically conductive standoff 106 is connected to first end 124 of first winding 104, and first electrically conductive standoff 106 extends along magnetic core 102 in the direction 114 from first outer surface 110 to second outer surface 112. Second electrically conductive standoff 108 is connected to second end 126 of first winding 104, and second electrically conductive standoff 108 extends along magnetic core 102 in first direction 114 from first outer surface 110 to the second outer surface 112. In some embodiments, each of first and second conductive standoffs 106 and 108 extends beyond first outer surface 110 in first direction 114, and each of first and second conductive standoffs 106 and 108 extends beyond second outer surface 112 in first direction 114. Although first electrically conductive standoff 106, second electrically conductive standoff 108, and first winding 104 are described as separate elements to help a reader distinguish these elements, these elements could be integrated. For example, opposing ends of first winding 104 could be shaped to form first electrically conductive standoff 106 and second electrically conductive standoff 108.

The fact that each of first and second electrically conductive standoffs 106 and 108 extends along magnetic core from first outer surface 110 to second outer surface 112 enables the electrically conductive standoffs, instead of magnetic core 102, to receive mechanical force applied to inductor 100, thereby protecting magnetic core 102 from the mechanical force and preventing associated cracking. For example, FIG. 1 illustrates mechanical force 130 and opposing mechanical force 132 applied to inductor 100 in direction 114. First and second electrical conductive standoffs 106 and 108 receive mechanical force 130 and 132, thereby protecting magnetic core 102 from this mechanical force. Consequently, certain embodiments of inductor 100 can advantageously tolerate significant force in direction 114 without risk of damage to magnetic core 102.

Figure 10:
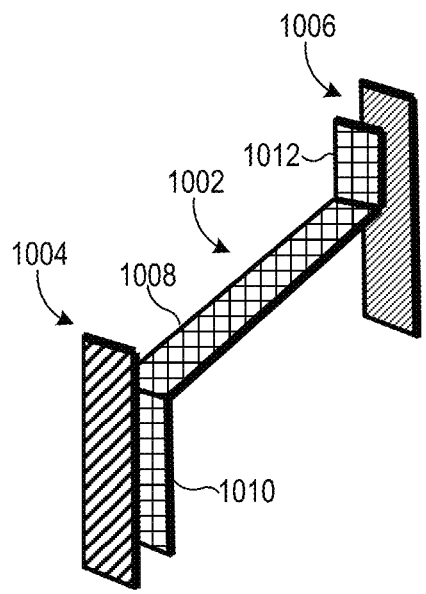
FIG. 10 illustrates one method for forming a winding and electrically conductive standoffs, according to an embodiment.
Figure 11:
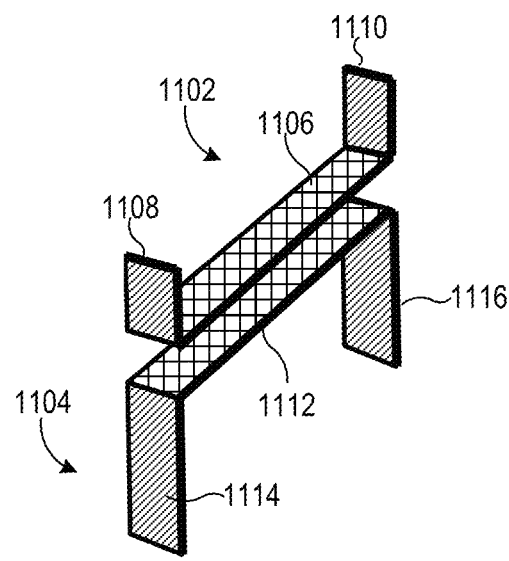
FIG. 11 illustrates another method for forming a winding and electrically conductive standoffs, according to an embodiment.
Figure 12:
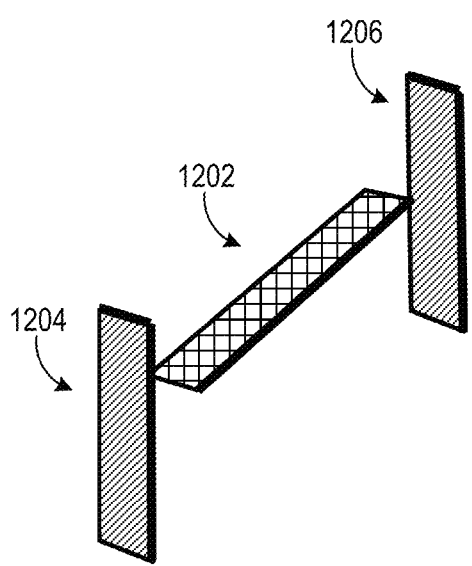
FIG. 12 illustrates another method for forming a winding and electrically conductive standoffs, according to an embodiment

FIGS. 10-12 illustrate respective methods for forming first winding 104 and first and second electrically conductive standoffs 106 and 108. It is understood, though, that first winding 104 and first and second electrically conductive standoffs 106 and 108 could be formed in other manners without departing from the scope hereof.

The FIG. 10 method begins with an electrically conductive first element 1002, an electrically conductive second element 1004, and an electrically conductive third element 1006. First element 1002 includes a central portion 1008, a first tab 1010, and a second tab 1012. Second element 1004 is joined to first tab 1010, and third element 1006 is joined to second tab 1012, such as by soldering, brazing, welding, or electroplating. Consequently, central portion 1008 embodies first winding 104, second element 1004 and first tab 1010 collectively embody first electrically conductive standoff 106, and third element 1006 and second tab 1012 collectively embody second electrically conductive standoff 108.

The FIG. 11 method begins with an electrically conductive first element 1102 and an electrically conductive second element 1104. First element 1102 includes a central portion 1106, a first tab 1108, and a second tab 1110. Second element 1104 includes a central portion 1112, a first tab 1114, and a second tab 1116. Central portion 1106 is joined to central portion 1112, such as by soldering, brazing, welding, or electroplating. Consequently, central portions 1106 and 1112 collectively embody first winding 104. First tabs 1108 and 1114 collectively embody first electrically conductive standoff 106, and second tabs 1110 and 1116 collectively embody second electrically conductive standoff 108.

The FIG. 12 method begins with an electrically conductive first element 1202, an electrically conductive second element 1204, and an electrically conductive third element 1206. First element 1202 is joined to each of second element 1204 and third element 1206, such as by soldering, brazing, welding, or electroplating. Consequently, first element 1202 embodies first winding 104, second element 1204 embodies first electrically conductive standoff 106, and third element 1206 embodies second electrically conductive standoff 108.

Figure 13:
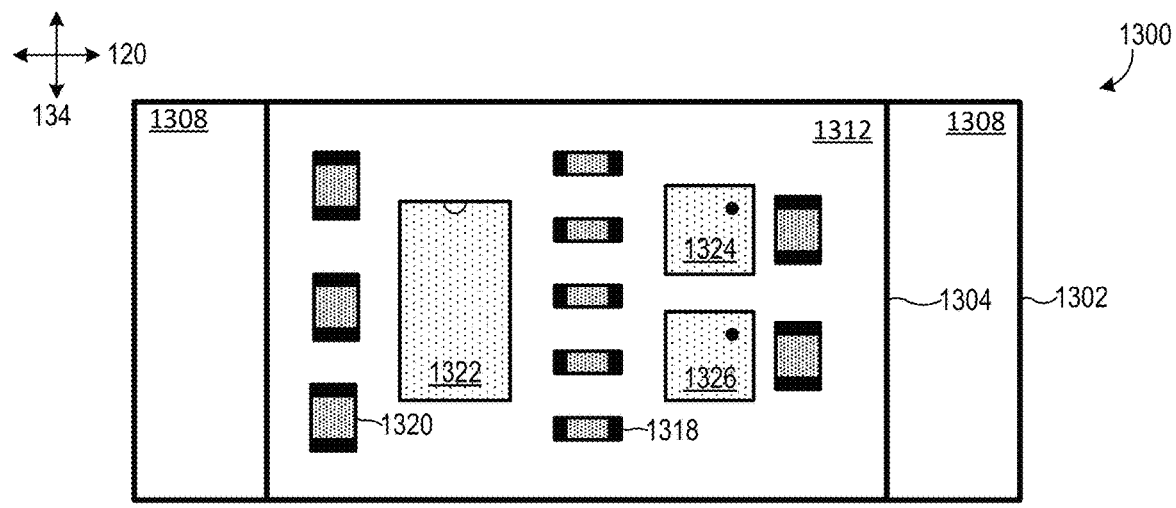
FIG. 13 is a top plan view of a circuit assembly including an instance of the FIG. 1 inductor, according to an embodiment.
Figure 14:
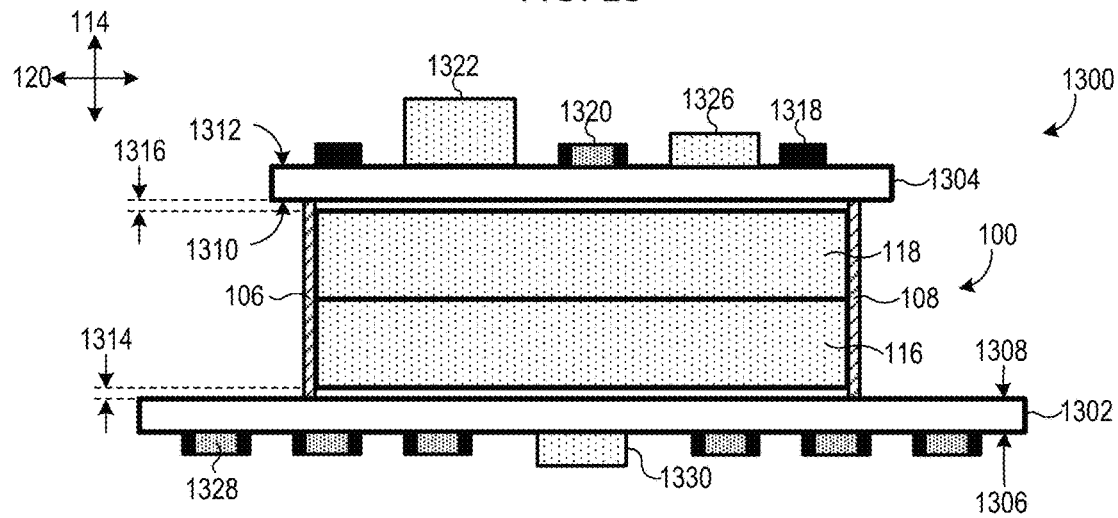
FIG. 14 is a front elevational view of the FIG. 13 circuit assembly.
Figure 15:
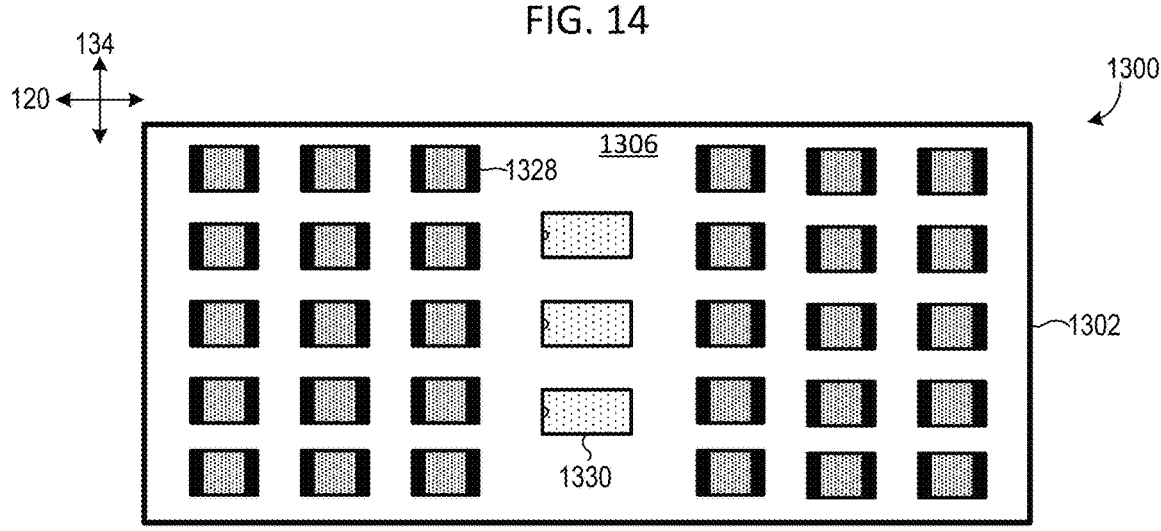
FIG. 15 is a bottom plan view of the FIG. 13 circuit assembly.

FIGS. 13-15 illustrate a circuit assembly 1300, which is one possible application of inductor 100. FIG. 13 is a top plan view of a circuit assembly 1300, FIG. 14 is a front elevational view of circuit assembly 1300, and FIG. 15 is a bottom plan view of circuit assembly 1300. Circuit assembly 1300 includes a first substrate 1302, a second substrate 1304, and an instance of inductor 100. Second substrate 1304 is separated from first substrate 1302 in direction 114. First substrate 1302 includes opposing outer surfaces 1306 and 1308 separated from each other in direction 114, and second substrate 1304 includes opposing outer surfaces 1310 and 1312 separated from each other in direction 114. In some embodiments, each of substrates 1302 and 1304 is a printed circuit board (PCB). Inductor 100 is disposed between first and substrates 1302 and 1304 in direction 114, such that each of substrate outer surfaces 1308 and 1310 faces inductor 100 (FIG. 14).

First and second electrically conductive standoffs 106 and 108 mechanically join first and second substrates 1302 and 1304. For example, in some embodiments, first and second electrically conductive standoffs 106 and 108 are sufficiently tall to touch each of first and second substrates 1302 and 1304, and the first and second electrically conductive standoff are sufficiently strong to fully support the weight of second substrate 1304 and its associated components (or the weight of first substrate 1302 and its associated components if circuit assembly 1300 is inverted). Accordingly, in some embodiments, electrically conductive standoffs 106 and 108 mechanically support first substrate 1302 and/or second substrate 1304. Magnetic core 102 is separated from first substrate 1302 in first direction 114 by a separation distance 1314, and first and second electrically conductive standoffs 106 and 108 bridge separation distance 1314 in direction 114. Additionally, magnetic core 102 is separated from second substrate 1304 in direction 114 by a separation distance 1316, and first and second electrically conductive standoffs 106 and 108 bridge separation distance 1316 in direction 114. Consequently, first and second electrically conductive standoffs 106 and 108 transfer mechanical force between first and second substrates 1302 and 1304 in direction 114, and first and second electrically conductive standoffs 106 and 108 thereby protect magnetic core 102 from mechanical force in direction 114.

Additionally, in some embodiments, first and second electrically conductive standoffs 106 and 108 electrically couple first and second substrates 1302 and 1304. Furthermore, one or more of first and second electrically conductive standoffs 106 and 108 optionally electrically couples inductor 100 to one or more of first and second substrates 1302 and 1304. In some embodiments, one or more of substrates 1302 and 1304 houses components. For example, FIGS. 13-15 collectively illustrate (a) passive components 1318, passive components 1320, and, integrated circuits 1322, 1324, and 1326 disposed on substrate outer surface 1312, and (b) passive components 1328 and integrated circuits 1330 disposed on substrate outer surface 1306. Only some instances of passive components 1318, passive components 1320, integrated circuits 1330, and passive components 1328 are labeled for illustrative clarity. In some embodiments, inductor 100 and one or more components on first substrate 1302 and/or second substrate 1304 form a power converter, such as a direct current (DC)-to-DC converter. The number, type, and layout of components on first and second substrates 1302 and 1304 may vary without departing from the scope hereof.

Furthermore, first and second electrically conductive standoffs 106 and 108 may facilitate thermal management of circuit assembly 1300. For example, consider a hypothetical scenario where integrated circuits 1324 and 1326 generate significant heat on second substrate 1304 that must be removed to prevent overheating. First and second electrically conductive standoffs 106 and 108 advantageously provide a direct path for heat to flow in direction 114 from second substrate 1304 to first substrate 1302, thereby helping cool second substrate 1304. Indeed, Applicant estimates that first and second electrically conductive standoffs 106 and 108 may achieve over twice the heat transfer than would be possible if the standoffs were omitted and an extension of first winding 104 connected the two substrates.

Figure 16:
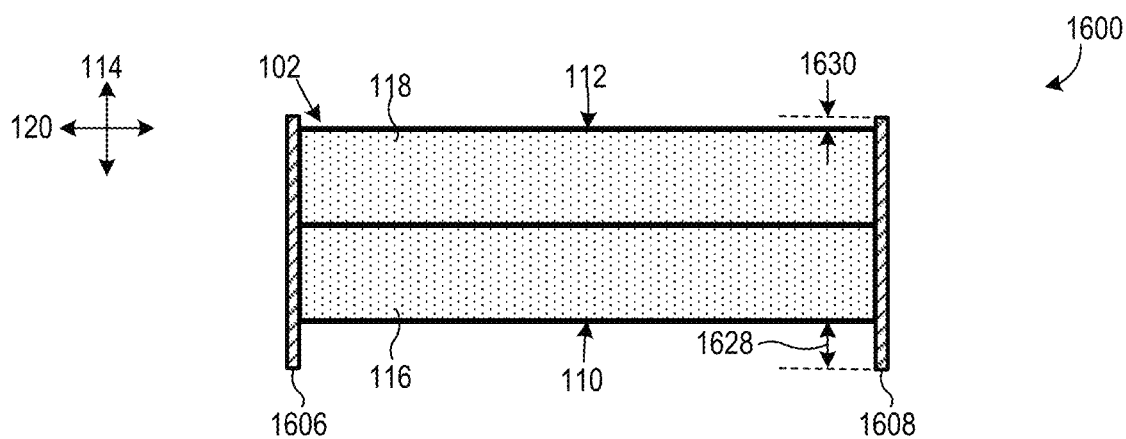
FIG. 16 is a front side elevational view of another inductor including electrically conductive standoffs, according to an embodiment.
Figure 17:
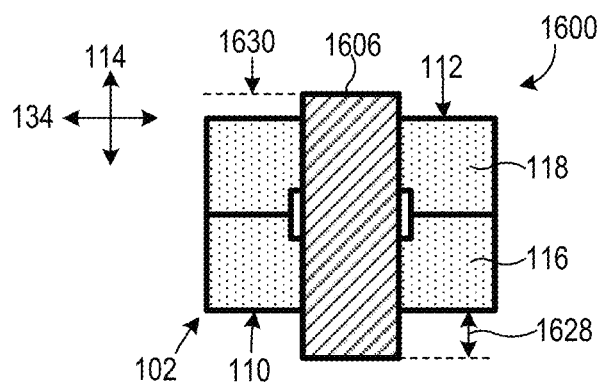
FIG. 17 is a left side elevational view of the FIG. 16 inductor.
Figure 18:
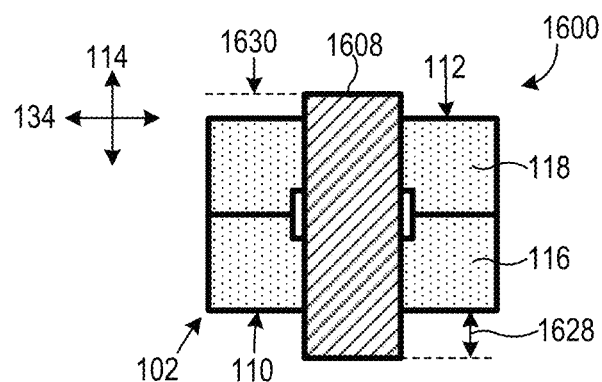
FIG. 18 is a right side elevational view of the FIG. 16 inductor.

In some alternate embodiments of inductor 100, first and second electrically conductive standoffs 106 and 108 extend beyond first and second outer surfaces 110 and 112 by different distances, such as to elevate magnetic core 102 above a substrate and thereby provide space for components under magnetic core 102. For example, FIG. 16 is a front side elevational view of an inductor 1600, FIG. 17 is a left side elevational view of inductor 1600, and FIG. 18 is a right side elevational view of inductor 1600. Inductor 1600 is like inductor 100 but with first and second electrically conductive standoffs 106 and 108 replaced with first and second electrically conductive standoffs 1606 and 1608, respectively. Each of first and second electrically conductive standoffs 1606 and 1608 extends beyond outer surface 110 in direction 114 by a distance 1628, and each of first and second electrically conductive standoffs 1606 and 1608 extends beyond outer surface 112 in direction 114 by a distance 1630. Distance 1628 is greater than distance 1630. Accordingly, in some applications of inductor 1600, one or more components (not shown) are disposed below magnetic core 102 in direction 114. For example, FIG. 19 is a front elevational view of a circuit assembly 1900, which is like circuit assembly 1300 of FIGS. 13-15, except that (a) inductor 100 is replaced by an instance of inductor 1600, and (b) the circuit assembly further includes components 1902 on substrate outer surface 1308 under inductor 1900. Only one instance of component 1902 is labeled to promote illustrative clarity.

Referring again to FIGS. 1-9, although first winding 104, first electrically conductive standoff 106, and second electrically conductive standoff 108 are illustrated as having a uniform width in a direction 134 that is orthogonal to each of direction 114 and direction 120, one or more first winding 104, first electrically conductive standoff 106, and second electrically conductive standoff 108 could have an alternative configuration. For example, FIGS. 20-24 illustrate several alternate embodiments of first winding 104, first electrically conductive standoff 106, and second electrically conductive standoff 108 having different configurations. However, first winding 104, first electrically conductive standoff 106, and second electrically conductive standoff 108 are not limited to these embodiments.

FIG. 20 is a perspective view of a winding 2004, a first electrically conductive standoff 2006, and a second electrically conductive standoff 2008, which are alternate embodiments of first winding 104, first electrically conductive standoff 106, and second electrically conductive standoff 108, respectively. The elements of FIG. 20 can advantageously be formed from a single piece of conductive material, such as metal. For example, opposing ends of winding 2004 could be shaped to form first electrically conductive standoff 2006 and second electrically conductive standoff 2008, respectively. However, the orientation of winding 2004 may necessitate that inductor 100 be relatively tall.

FIG. 21 is a perspective view of a winding 2104, a first electrically conductive standoff 2106, and a second electrically conductive standoff 2108, which are alternate embodiments of first winding 104, first electrically conductive standoff 106, and second electrically conductive standoff 108, respectively. The elements of FIG. 21 can also be formed from a single piece of conductive material, such as metal. For example, opposing ends of winding 2104 could be shaped to form first electrically conductive standoff 2106 and second electrically conductive standoff 2108, respectively. Additionally, the FIG. 21 configuration promotes low inductor height. Furthermore, the FIG. 21 configuration promotes low DC resistance (DCR) in applications where current flows as illustrated by the dashed-line arrows in FIG. 21, i.e. into standoff bottom 2210, through winding 2104, and out of standoff bottom 2112 (or in reverse direction), due to the large cross-sectional areas of standoff bottoms 2110 and 2112. On the other hand, if current flows through one or both of standoff tops 2114 and 2116, the FIG. 21 configuration will have a higher DCR, due to the smaller cross-sectional areas of standoff tops 2114 and 2116.

Figure 22:
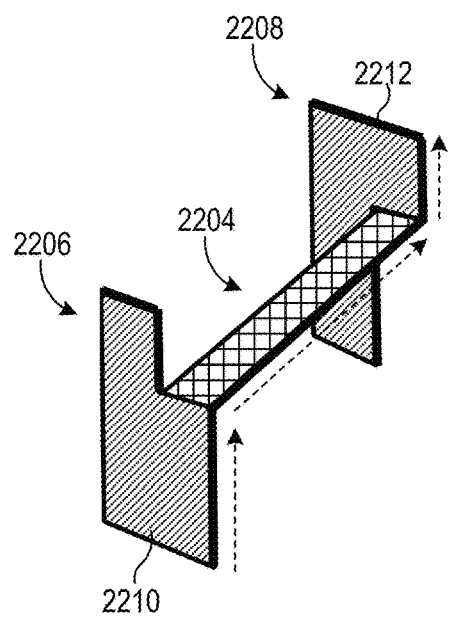
FIG. 22 is a perspective view of another alternate embodiment of a winding and electrically conductive standoffs of the FIG. 1 inductor.

FIG. 22 is a perspective view of a winding 2204, a first electrically conductive standoff 2206, and a second electrically conductive standoff 2208, which are alternate embodiments of first winding 104, first electrically conductive standoff 106, and second electrically conductive standoff 108, respectively. The FIG. 22 configuration is similar to the FIG. 21 configuration, but the FIG. 22 configuration may achieve a lower DCR than the FIG. 21 configuration in applications where current flows as illustrated by dashed lines in FIG. 22 (or in reverse direction). This low DCR is achieved by the large cross-sectional areas of standoff bottom 2210 and standoff top 2212, which are in the current path illustrated by dashed lines in FIG. 22.

Figure 23:
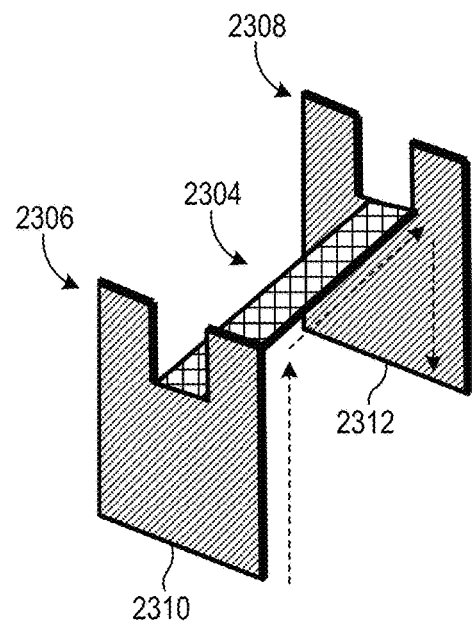
FIG. 23 is a perspective view of another alternate embodiment of a winding and electrically conductive standoffs of the FIG. 1 inductor.

FIG. 23 is a perspective view of a winding 2304, a first electrically conductive standoff 2306, and a second electrically conductive standoff 2308, which are alternate embodiments of first winding 104, first electrically conductive standoff 106, and second electrically conductive standoff 108, respectively. The elements of FIG. 23 can also be formed from a single piece of conductive material, such as metal. For example, opposing ends of winding 2304 could be shaped to form first electrically conductive standoff 2306 and second electrically conductive standoff 2308, respectively. The FIG. 23 configuration will achieve its lowest DCR in applications where current flows as illustrated by dashed lines in FIG. 23 (or in reverse direction) due to the large cross-sectional areas of standoff bottoms 2310 and 2312.

Figure 24:
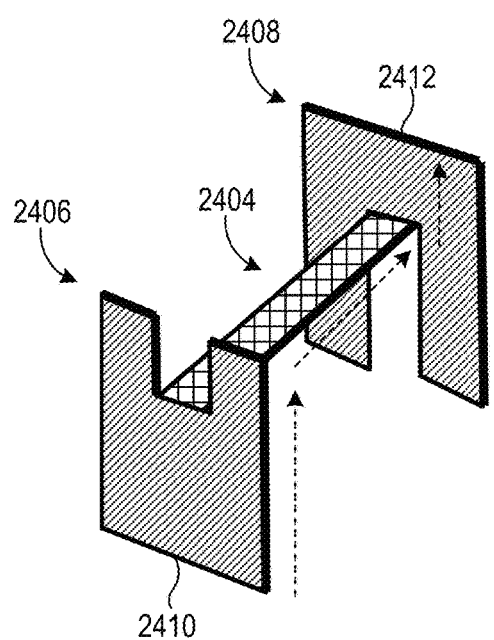
FIG. 24 is a perspective view of another alternate embodiment of a winding and electrically conductive standoffs of the FIG. 1 inductor.

FIG. 24 is a perspective view of a winding 2404, a first electrically conductive standoff 2406, and a second electrically conductive standoff 2408, which are alternate embodiments of first winding 104, first electrically conductive standoff 106, and second electrically conductive standoff 108, respectively. The FIG. 24 configuration is similar to the FIG. 23 configuration, but the FIG. 24 configuration will achieve its lowest DCR in applications where current flows as illustrated by dashed lines in FIG. 24 (or in reverse direction) due to the large cross-sectional areas of standoff bottom 2410 and standoff top 2412.

Figure 25:
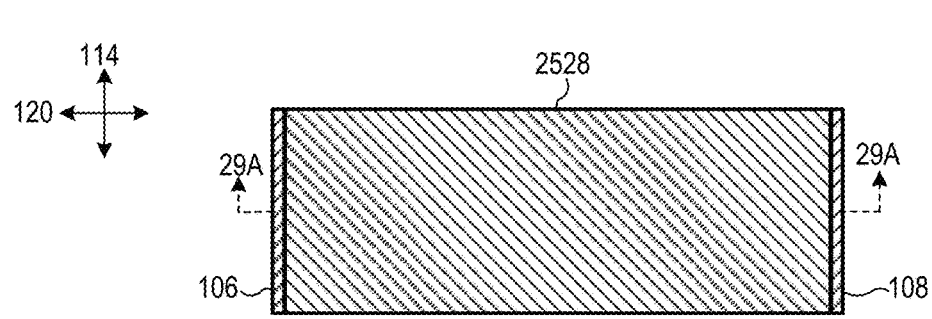
FIG. 25 is a front side elevational view of an inductor including electrically four conductive standoffs, according to an embodiment.
Figure 26:
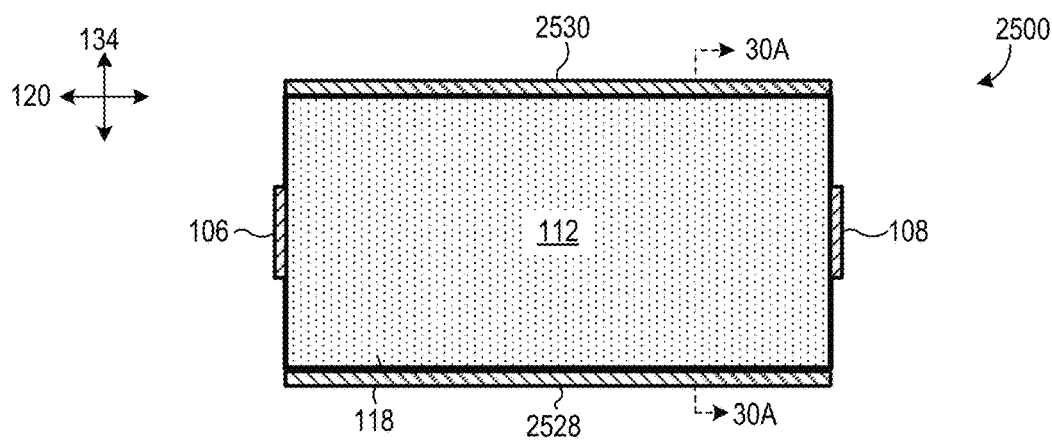
FIG. 26 is a top plan view of the FIG. 25 inductor.
Figure 27:
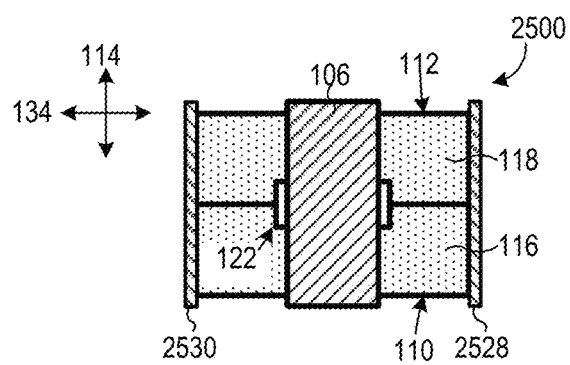
FIG. 27 is a left side elevational view of the FIG. 25 inductor.
Figure 28:
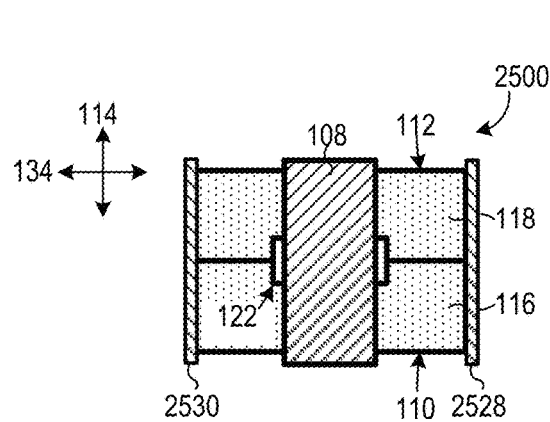
FIG. 28 is a right side elevational view of the FIG. 25 inductor.
Figure 29:
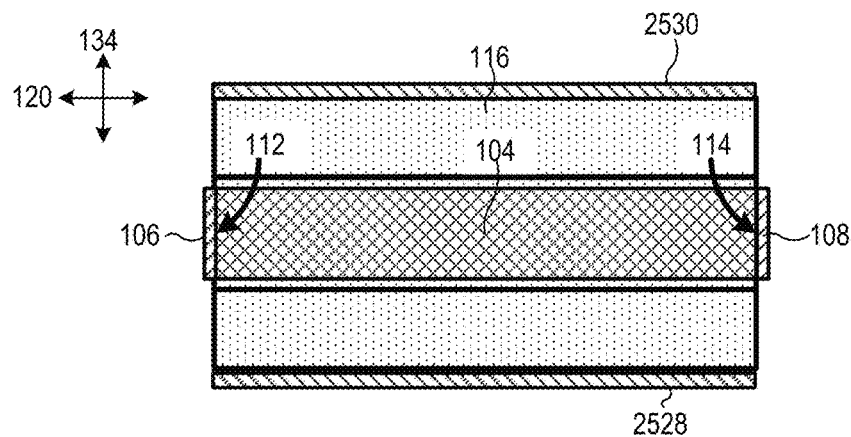
FIG. 29 is a cross-sectional view of the FIG. 25 inductor taken along line 29A-29A of FIG. 25.
Figure 30:
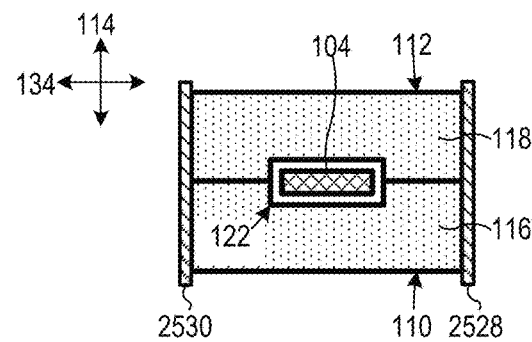
FIG. 30 is a cross-sectional view of the FIG. 25 inductor taken along line 30A-30A of FIG. 26.
Figure 31:
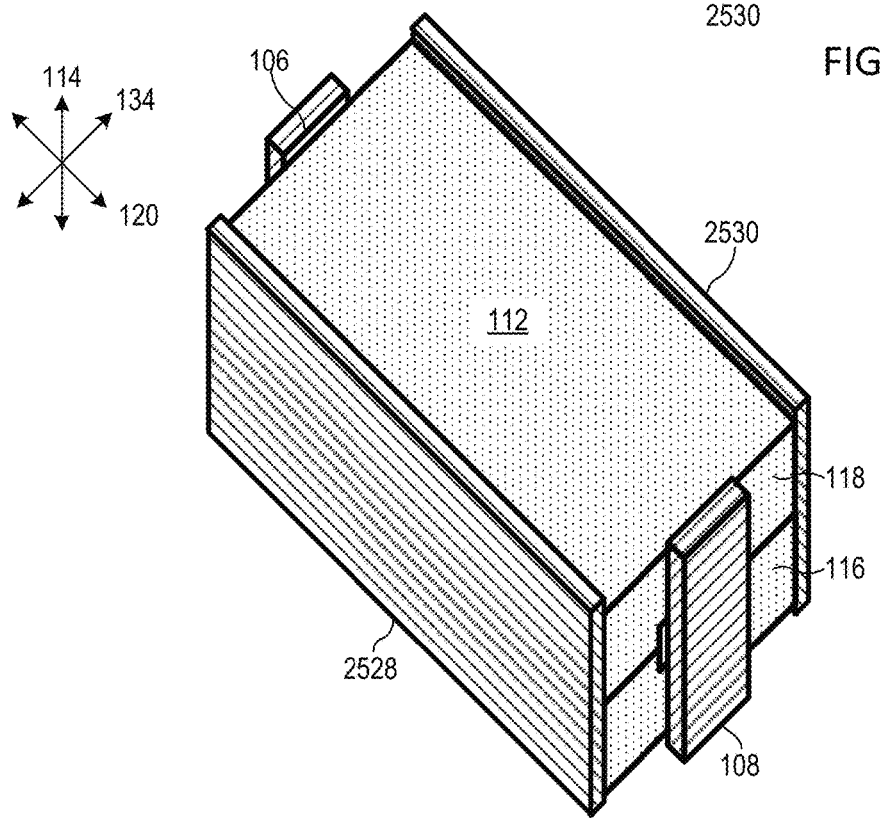
FIG. 31 is a perspective view of the FIG. 25 inductor.

Any of the inductors disclosed herein could be modified to have additional or fewer electrically conductive standoffs without departing from the scope hereof. For example, FIGS. 25-31 illustrate an inductor 2500, which is an embodiment of inductor 100 further including third and fourth electrically conductive standoffs 2528 and 2530. FIG. 25 is a front side elevational view of inductor 2500, and FIG. 26 is a top plan view of inductor 2500. FIG. 27 is a left side elevational view of inductor 2500, and FIG. 28 is a right side elevational view of inductor 2500. FIG. 29 is a cross-sectional view of inductor 2500 taken along line 29A-29A of FIG. 25, and FIG. 30 is a cross-sectional view of inductor 2500 taken along line 30A-30A of FIG. 26. FIG. 31 is a perspective view of inductor 2500.

Third electrically conductive standoff 2528 extends along magnetic core 102 in first direction 114 from first outer surface 110 to the second outer surface 112, and fourth electrically conductive standoff 2530 extends along magnetic core 102 in first direction 114 from first outer surface 110 to the second outer surface 112. In contrast to first and second electrically conductive standoffs 106 and 108, third and fourth electrically conductive standoffs 2528 and 2530 are not connected to first winding 104. Accordingly, third and fourth electrically conductive standoffs 2528 and 2530 are used as power rail conductors and/or ground inductors in some applications of inductor 2500. Third and fourth electrically conductive standoffs 2528 and 2530 may also promote electromagnetic compatibility of inductor 2500 with other circuitry by helping prevent fringing magnetic flux from extending beyond inductor 2500.

Figure 32:
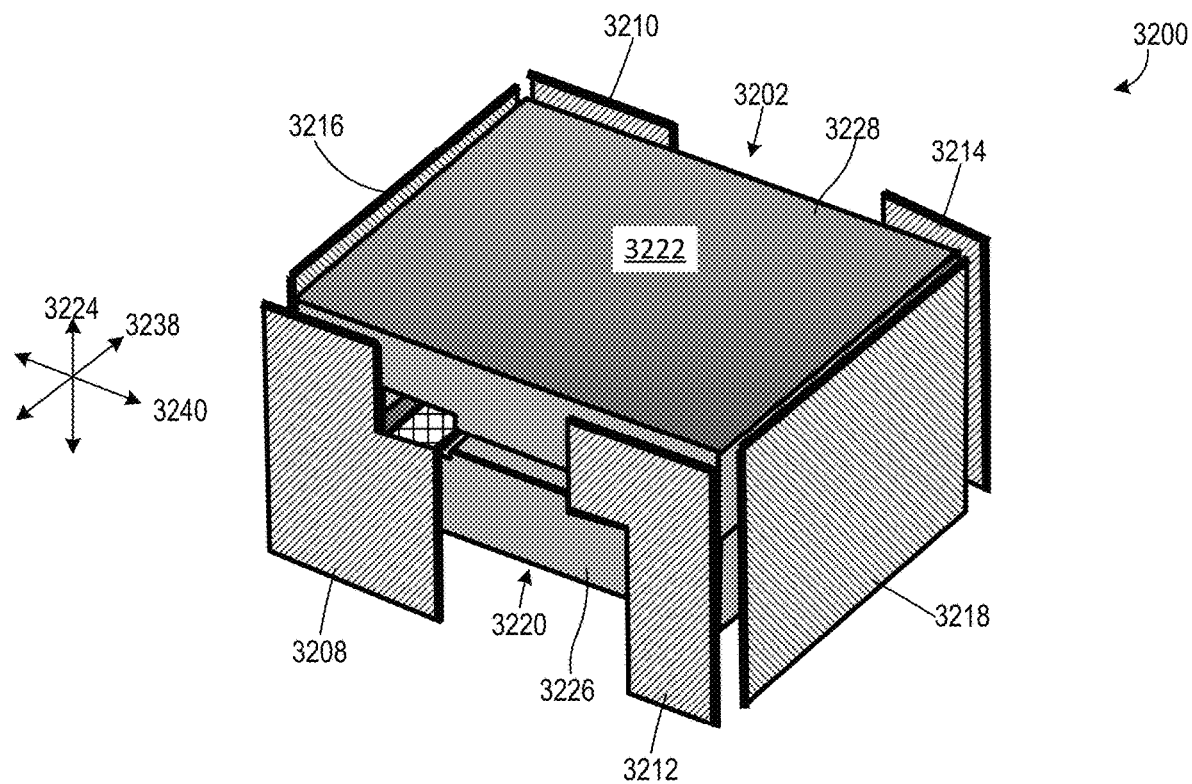
FIG. 32 is a perspective view of a coupled inductor including electrically conductive standoffs, according to an embodiment.

The inductors discussed above could be modified to include one or more additional windings and thereby be coupled inductors. For example, FIG. 32 is a perspective view of a coupled inductor 3200 including six electrically conductive standoffs. Coupled inductor 3200 includes a magnetic core 3202, a first winding 3204, a second winding 3206, a first electrically conductive standoff 3208, a second electrically conductive standoff 3210, a third electrically conductive standoff 3212, a fourth electrically conductive standoff 3214, a fifth electrically conductive standoff 3216, and a sixth electrically conductive standoff 3218.

Figure 33:
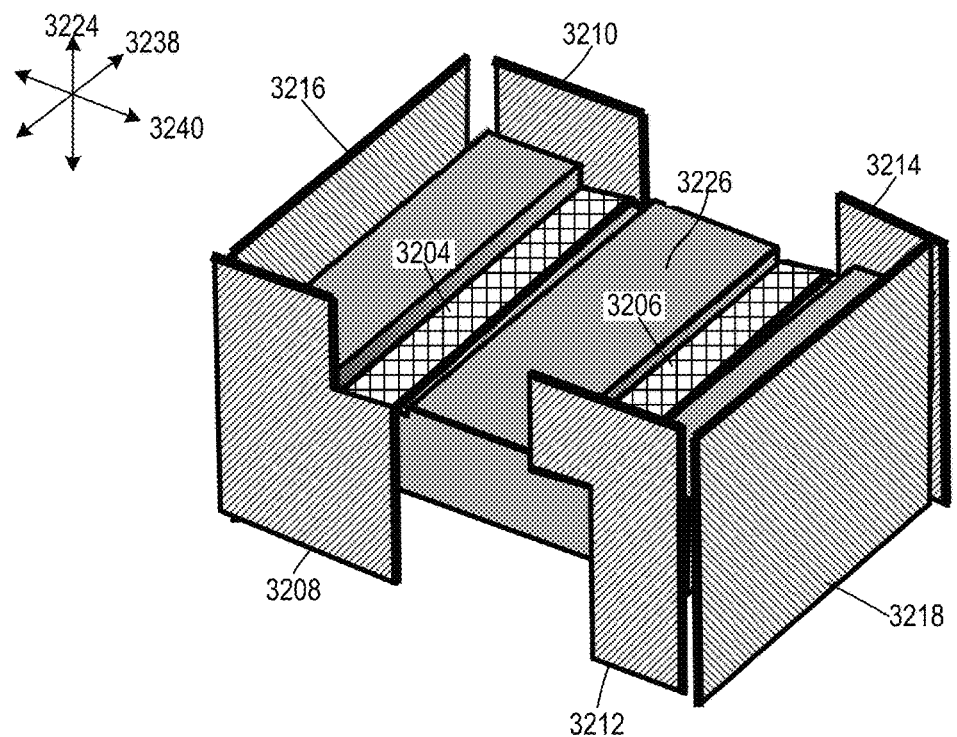
FIG. 33 is a perspective view of the FIG. 32 coupled inductor with a portion of a magnetic core omitted.
Figure 34:
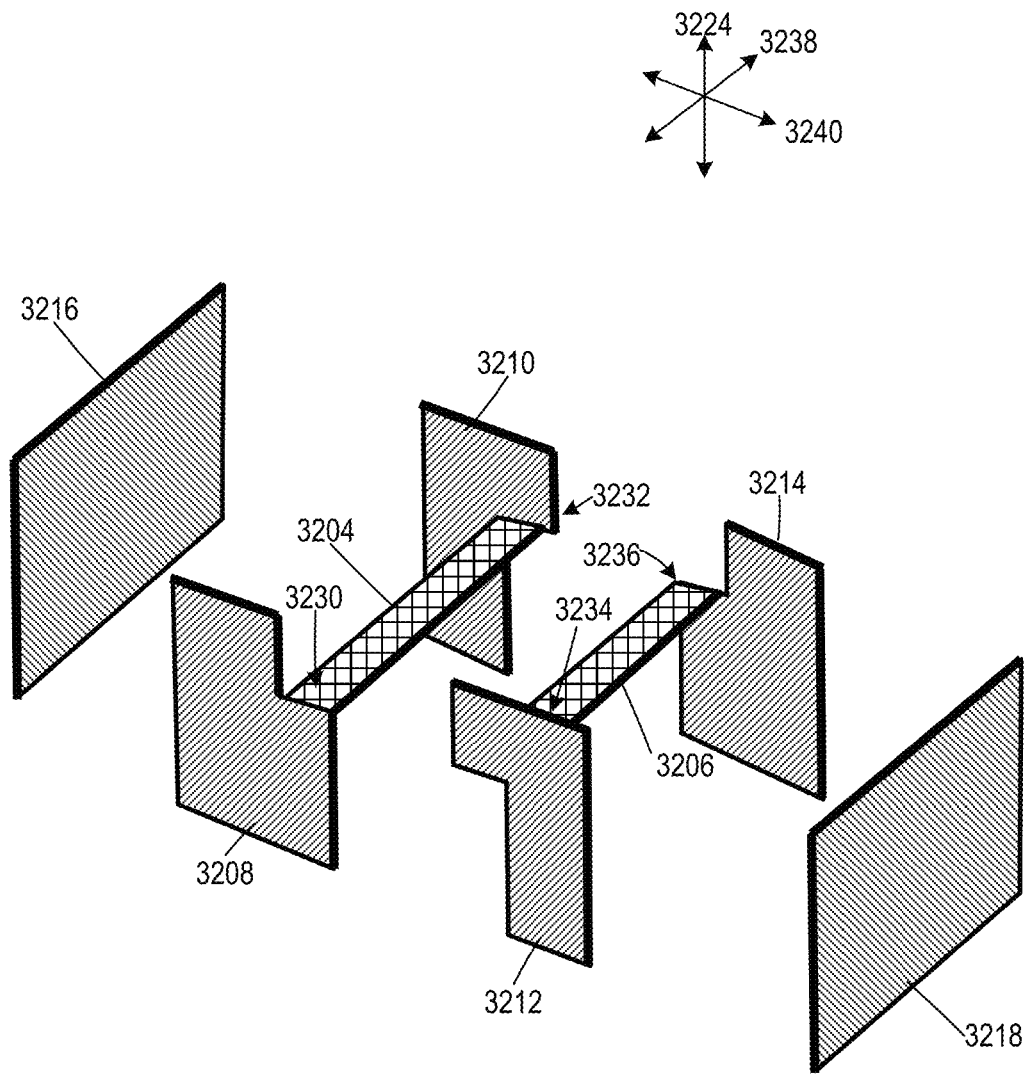
FIG. 34 is an exploded perspective view of the FIG. 32 coupled inductor with the entire magnetic core omitted.

Magnetic core 3202 includes a first outer surface 3220 and an opposing second outer surface 3222 separated from each other in a direction 3224. Magnetic core 3202 is formed, for example, of a ferrite magnetic material. Magnetic core 3202 includes a first portion 3226 and a second portion 3228 stacked on each other in direction 3224. FIG. 33 is a perspective view of coupled inductor 3200 with second portion 3228 omitted to show windings 3204 and 3206. FIG. 34 is an exploded perspective view of coupled inductor 3200 with magnetic core 3202 omitted.

In some embodiments, there is gap between first portion 3226 and a second portion 3228, such to help prevent magnetic saturation of magnetic core 3202. The gap includes, for example, air, plastic, paper, or a magnetic material having a lower magnetic permeability than first and second portions 3226 and 3228. In the illustrated embodiments, each of first portion 3226 and second portion 3228 has a U-shape. However, one or more first and second portions 3226 and 3228 could have other shapes without departing from the scope hereof. For example, first portion 3226 could alternately have an I-shape while second portion 3228 has a U-shape. Additionally, magnetic core 3202 could be formed of additional portions or fewer portions without departing from the scope hereof. For example, in an alternate embodiment, magnetic core 3202 is a single-piece monolithic block core, and in another alternate embodiment, magnetic core 3202 includes three portions (not shown).

First winding 3204 is wound partially around first portion 3226 of magnetic core 3202 (FIG. 33), and first winding 3204 has opposing ends 3230 and 3232 separated from each other in a direction 3238 (FIGS. 33 and 34), where direction 3238 is orthogonal to direction 3224. Second winding 3206 is wound partially around first portion 3226 of magnetic core 3202 (FIG. 33), and second winding 3206 has opposing ends 3234 and 3236 separated from each other in direction 3238 (FIGS. 33 and 34). First and second windings 3204 and 3206 are separated from each other in a direction 3240 that is orthogonal to each of directions 3224 and 3238. First electrically conductive standoff 3208 is connected to first end 3230 of first winding 3204, and first electrically conductive standoff 3208 extends along magnetic core 3202 in the direction 3224 from first outer surface 3220 to second outer surface 3222. Second electrically conductive standoff 3210 is connected to second end 3232 of first winding 3204, and second electrically conductive standoff 3210 extends along magnetic core 3202 in first direction 3224 from first outer surface 3220 to the second outer surface 3222. Third electrically conductive standoff 3212 is connected to first end 3234 of second winding 3206, and third electrically conductive standoff 3212 extends along magnetic core 3202 in the direction 3224 from first outer surface 3220 to second outer surface 3222. Fourth electrically conductive standoff 3214 is connected to second end 3236 of second winding 3206, and fourth electrically conductive standoff 3214 extends along magnetic core 3202 in the direction 3224 from first outer surface 3220 to second outer surface 3222. Although each winding 3204 and 3206 is described as being separate from its respective electrically conductive standoffs to help a reader distinguish these elements, each winding 3204 and 3206 could be integrated with its respective electrically conductive standoffs. For example, opposing ends of first winding 3204 could be shaped to form first electrically conductive standoff 3208 and second electrically conductive standoff 3210.

Each of fifth electrically conductive standoff 3216 and sixth electrically conductive standoff 3218 extends along magnetic core 3202 in first direction 3224 from first outer surface 3220 to the second outer surface 3222. In contrast to first through fourth electrically conductive standoffs 3208-3214, fifth and sixth electrically conductive standoffs 3216 and 3218 are not connected to first winding 3204 or second winding 3206. In some embodiments, each of first through sixth conductive standoffs 3208-3218 extends beyond first outer surface 3220 in first direction 3224, and each of first through sixth conductive standoffs 3208-3218 extends beyond second outer surface 3222 in first direction 3224.

Figure 35:
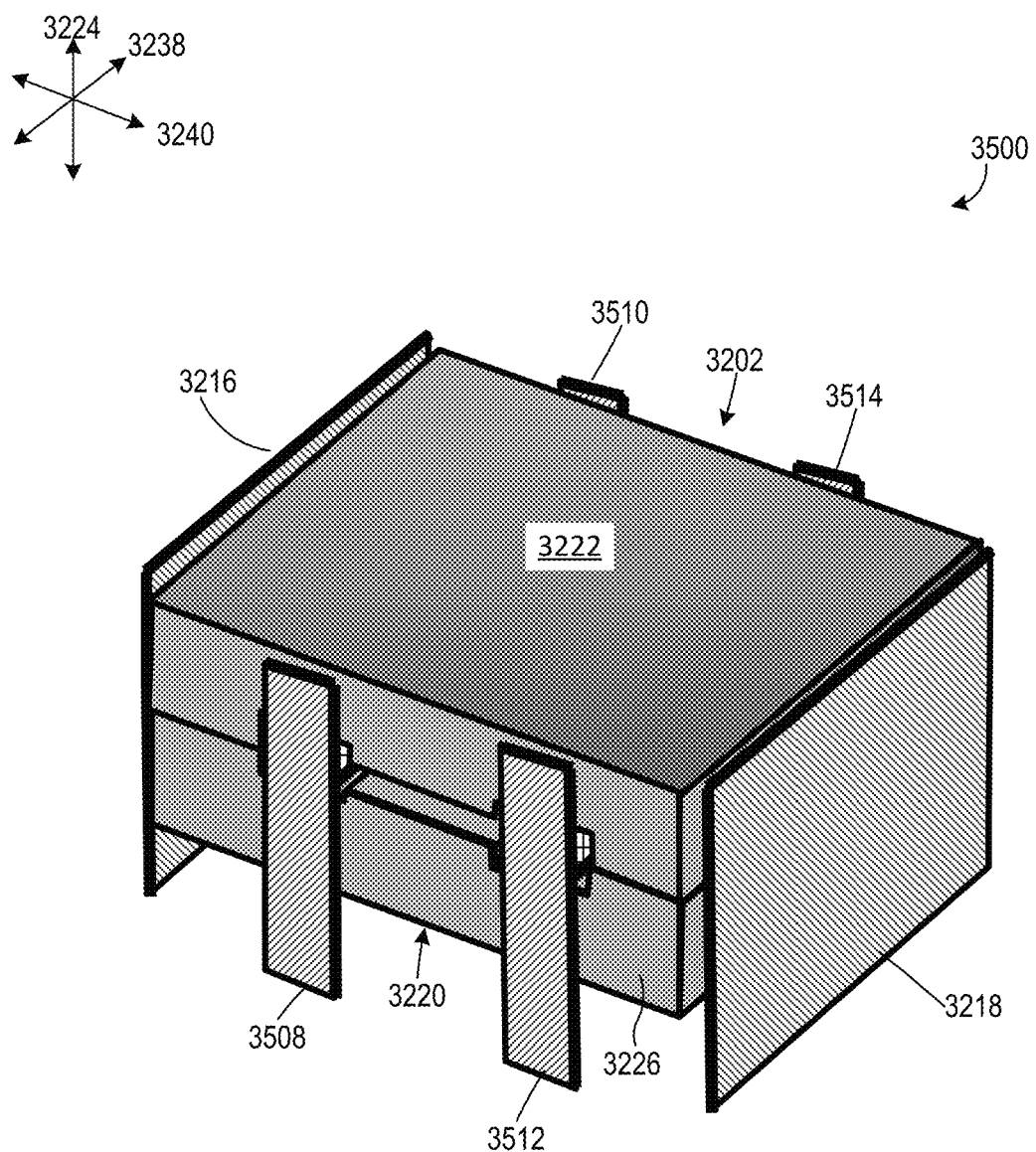
FIG. 35 is a perspective view of an alternate embodiment of the FIG. 35 coupled inductor.

Coupled inductor 3200 could be configured to have a different winding and/or electrically conductive standoff configuration. For example, FIG. 35 is a perspective view of coupled inductor 3500, which is like coupled inductor 3200 of FIG. 32 but with electrically conductive standoffs 3208-3214 replaced with electrically conductive standoffs 3508-3514, respectively. Each of electrically conductive standoffs 3508-3514 extends along magnetic core 3202 in first direction 3224 from first outer surface 3220 to the second outer surface 3222. In some embodiments, each of electrically conductive standoffs 3508-3514 extends beyond first outer surface 3220 in first direction 3224, and each of electrically conductive standoffs 3508-3514 extends beyond second outer surface 3222 in first direction 3224.

Figure 36:
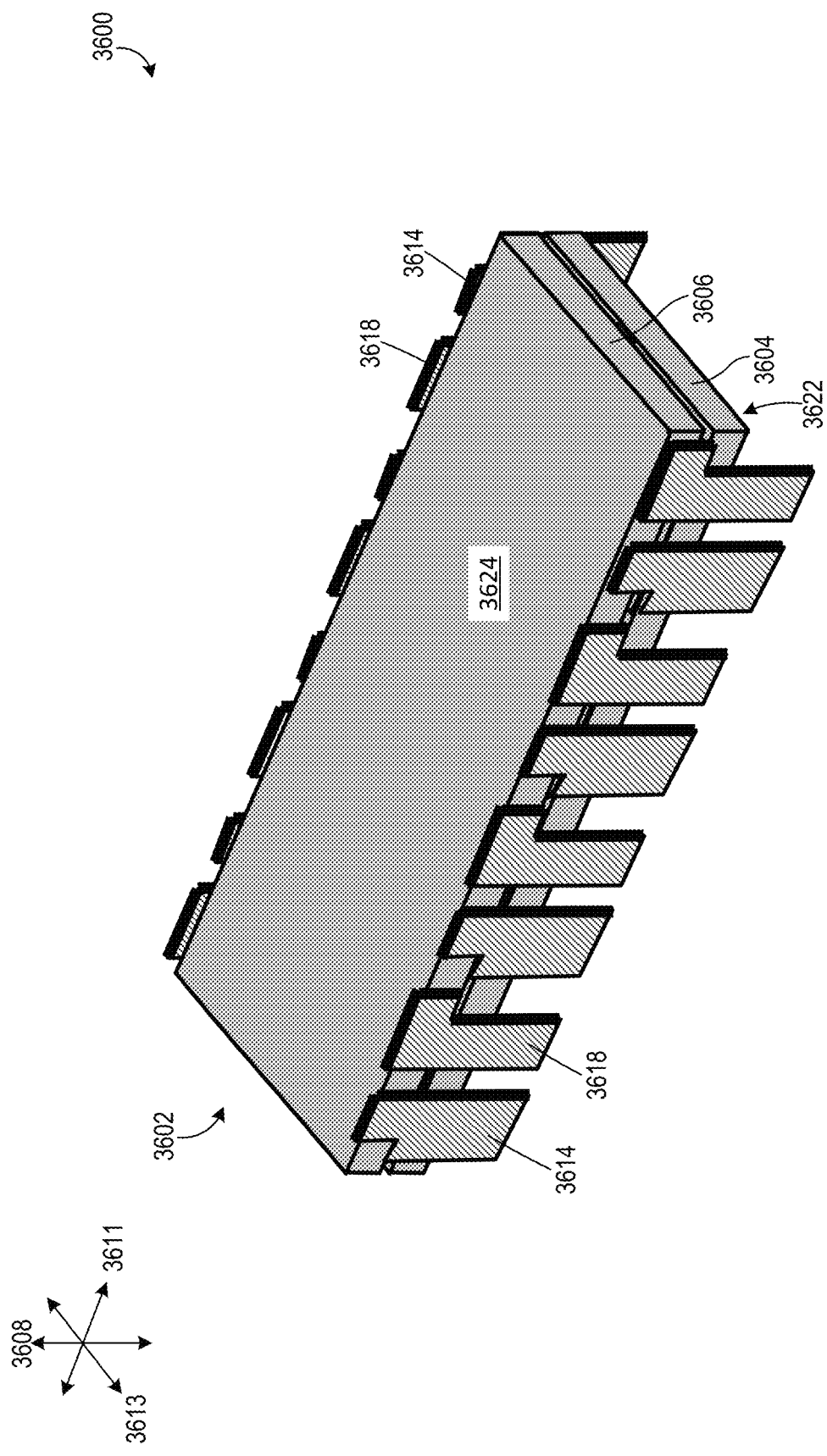
FIG. 36 is a perspective view of another coupled inductor including electrically conductive standoffs, according to an embodiment.
Figure 37:
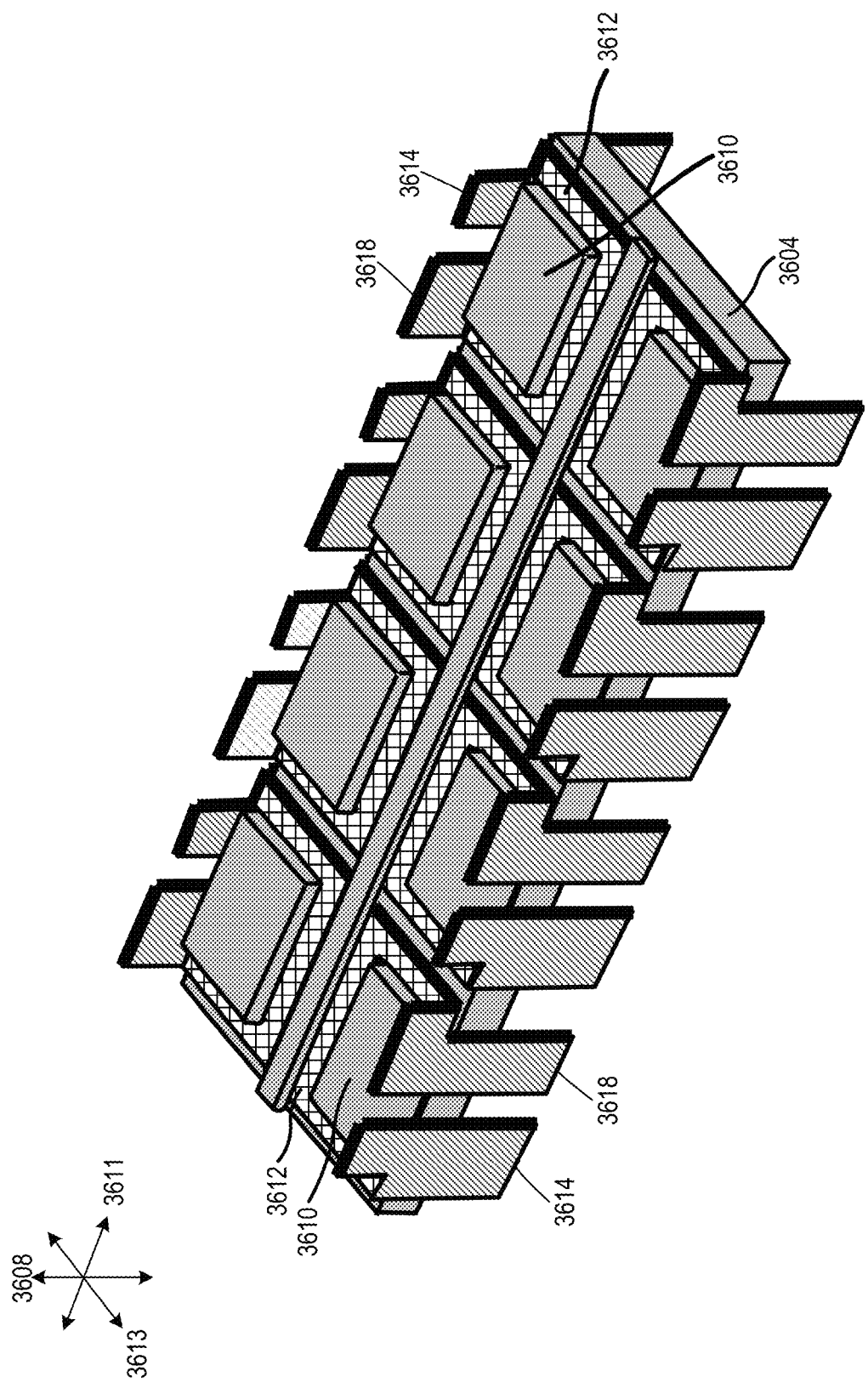
FIG. 37 is a perspective view of the FIG. 36 coupled inductor with a portion of a magnetic core omitted.
Figure 38:
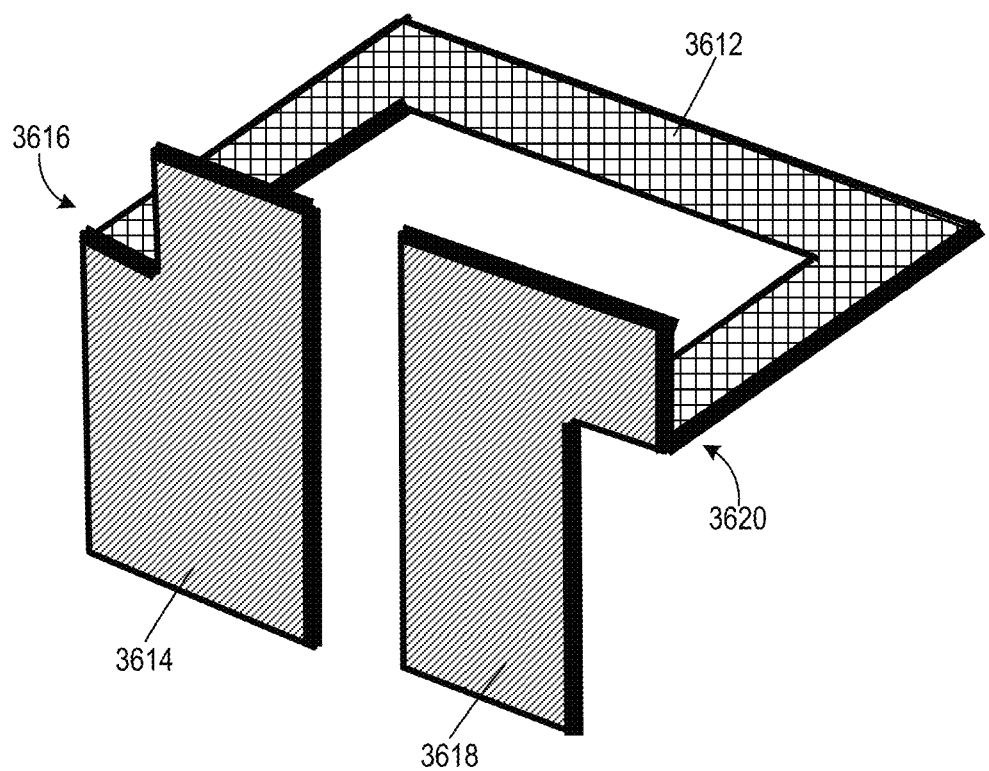
FIG. 38 is a perspective view of a winding instance of the FIG. 36 coupled inductor, and associated electrically conductive standoffs, separated from the remainder of the coupled inductor.

FIGS. 36 and 37 illustrate another example of a coupled inductor including electrically conductive standoffs. FIG. 36 is a perspective view of a coupled inductor 3600 including a magnetic core 3602, where magnetic core 3602 includes a first portion 3604 and a second portion 3606 stacked in a direction 3608. FIG. 37 is a perspective view of coupled inductor 3600 with second portion 3606 of magnetic core 3602 omitted, to show an interior of coupled inductor 3600. Magnetic core 3602 further includes a plurality of teeth 3610 (FIG. 37) disposed between first portion 3604 and second portion 3606 in direction 3608. Teeth 3610 are separated from each other in directions 3611 and 3613, where each of directions 3608, 3611, and 3613 is orthogonal to each other of directions 3608, 3611, and 3613. The number of teeth 3610 and the layout of teeth 3610 may vary without departing from the scope hereof. Only two instances of teeth 3610 are labeled for illustrative clarity. A respective winding 3612 is partially wound around each tooth 3610, although only two windings 3612 are labeled in FIG. 37 for illustrative clarity. FIG. 38 is a perspective view of one winding 3612 instance and associated electrically conductive standoffs separate from the remainder of coupled inductor 3600.

A respective first electrically conductive standoff 3614 is connected to each first end 3616 of each winding 3612, and a respective second electrically conductive standoff 3618 is connected to each second end 3620 of each winding 3612 (see FIG. 38). Only two instances of each of first and second electrically conductive standoffs 3614 and 3618 are labeled in FIGS. 36 and 37 for illustrative clarity. Each first electrically conductive standoff 3614 extends along magnetic core 3202 in direction 3608 from a first outer surface 3622 of magnetic core 3602 to a second outer surface 3624 of magnetic core 3602 (FIG. 36). Each second electrically conductive standoff 3618 extends along magnetic core 3202 in direction 3608 from first outer surface 3622 of magnetic core 3602 to second outer surface 3624 of magnetic core 3602. First and second outer surfaces 3622 and 3624 are separated from each other in direction 3608. In some embodiments, each first and second electrically conductive standoff 3614 and 3618 extends beyond first outer surface 3622 in first direction 3608, and each of first and second electrically conductive standoff 3614 and 3618 extends beyond second outer surface 3624 in first direction 3608. While not required, first and second electrically conductive standoffs 3614 and 3618 will achieve lowest DCR when current flows into the bottom of standoff 3614 and out of the top of standoff 3618, or in reverse direction, due to relatively large cross-sectional area of standoff 3614 bottom and standoff 3618 top. Although first electrically conductive standoff 3614, second electrically conductive standoff 3618, and first winding 3612 are described as being separate elements to help a reader distinguish these elements, these elements could be integrated. For example, opposing ends of winding 3612 could be shaped to form first electrically conductive standoff 3614 and second electrically conductive standoff 3618, respectively.

Figure 39:
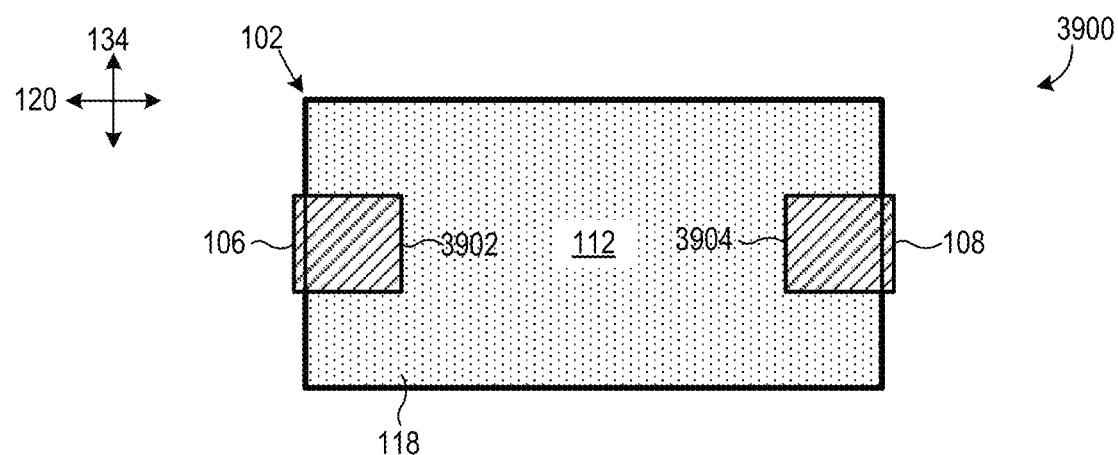
FIG. 39 is a top plan view of an alternate embodiment of the FIG. 1 inductor where electrically conductive standoffs form tabs on magnetic core outer surfaces.
Figure 40:
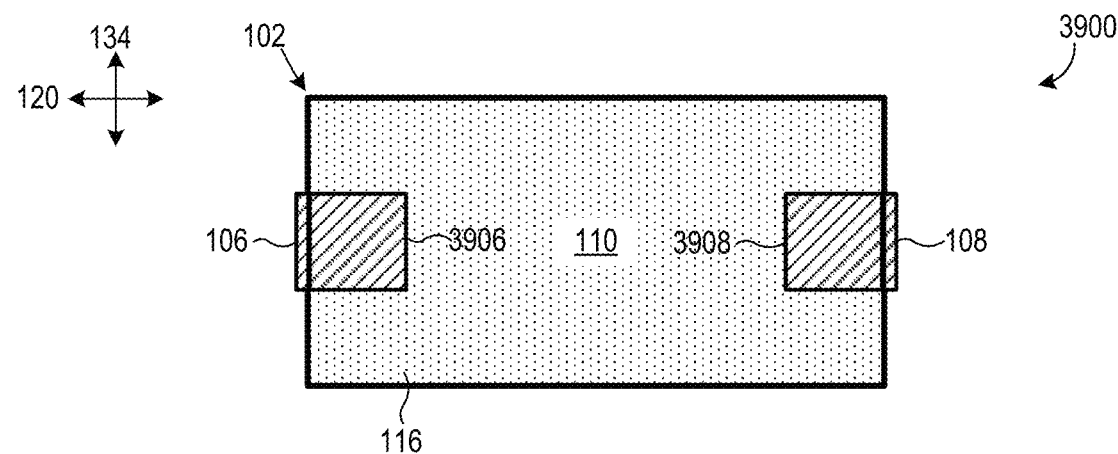
FIG. 40 is a bottom plan view of the FIG. 39 inductor.

Any of the inductors disclosed herein could be modified so that one or more of its electrically conductive standoffs forms a tab, e.g. a solder tab, on a magnetic core outer surface. For example, FIG. 39 is a top plan view of an inductor 3900, and FIG. 40 is a bottom plan view of inductor 3900, where inductor 3900 is an alternate embodiment of inductor 100 where electrically conductive standoffs 106 and 108 form respective tabs on each of outer surfaces 110 and 112. Specifically, electrically conductive standoffs 106 and 108 form tabs 3902 and 3904, respectively, on outer surface 112, and electrically conductive standoffs 106 and 108 form tabs 3906 and 3908, respectively, on outer surface 110. It should be noted that tabs 3902 and 3904 need not contact outer surface 112 and that tabs 3906 and 3908 need not contact outer surface 110.

Figure 41:
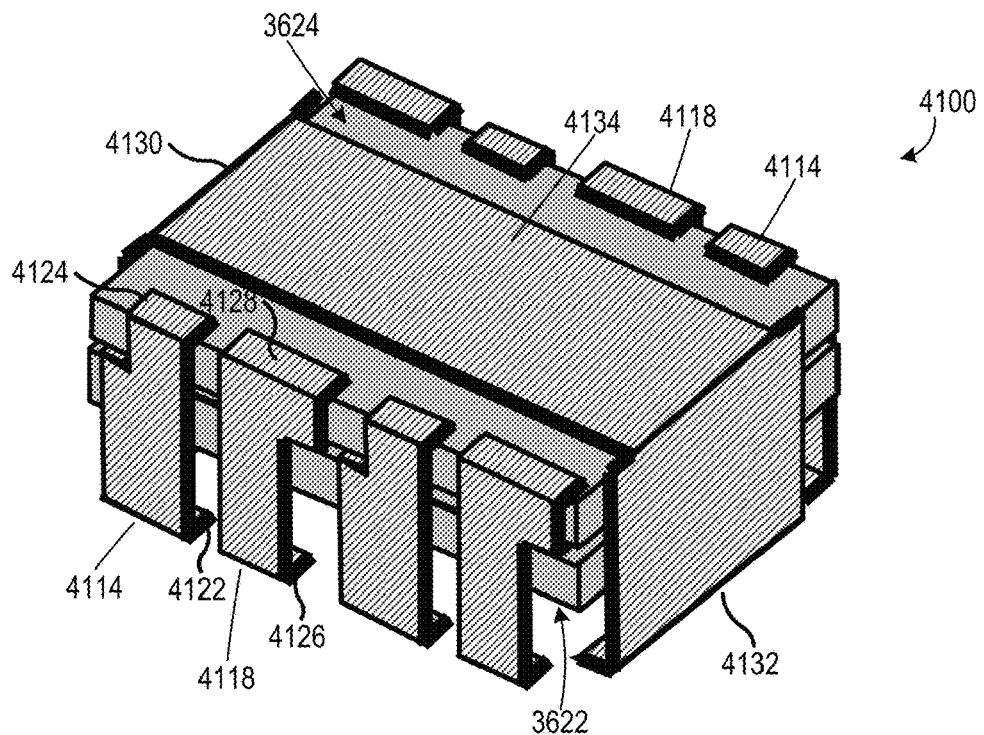
FIG. 41 is a perspective view of the FIG. 36 coupled inductor where electrically conductive standoffs form tabs on magnetic core outer surfaces.
Figure 42:
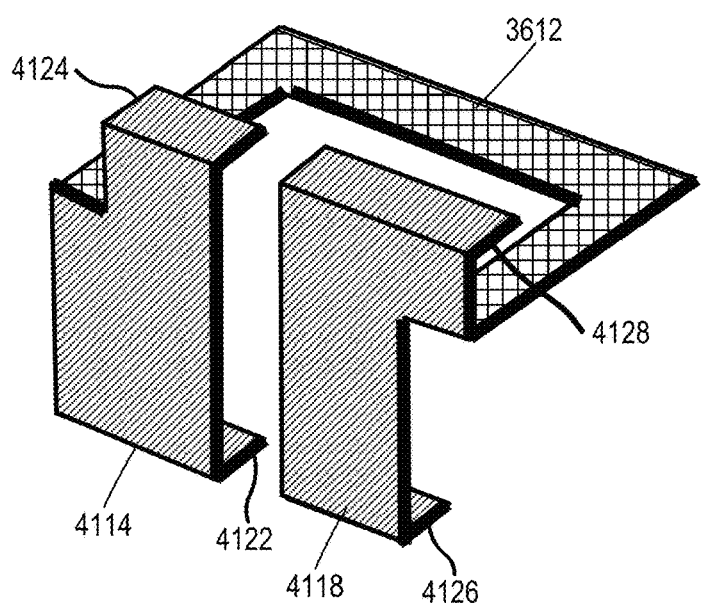
FIG. 42 is a perspective view of a winding instance of the FIG. 41 coupled inductor, and associated electrically conductive standoffs, separated from the remainder of the coupled inductor.

FIG. 41 is a perspective view of a coupled inductor 4100, which is an alternate embodiment of coupled inductor 3600 including four teeth 3610, where electrically conductive standoffs form tabs on magnetic core outer surfaces. In coupled inductor 4100, each first electrically conductive standoff 3614 is replaced with a first electrical conductive standoff 4114, and each second electrically conductive standoff 3618 is replaced with a second electrically conductive standoff 4118. FIG. 42 is a perspective view of one winding 3612 instance and associated electrically conductive standoffs separate from the remainder of coupled inductor 4100. Each first electrically conductive standoff 4114 forms respective tabs 4122 and 4124 on magnetic core outer surfaces 3622 and 3624, respectively. Additionally, each second electrically conductive standoff 4118 forms respective tabs 4126 and 4128 on magnetic core outer surfaces 3622 and 3624, respectively. In some embodiments, electrically conductive standoffs 4114 and 4118, tabs 4122, 4124, 4126, and 4128, and winding 3612 are integrated. It should be noted that tabs 4122 and 4126 need not contact outer surface 3622 and that tabs 4124 and 4128 need not contact outer surface 3624. Coupled inductor 4100 additionally includes electrically conductive standoffs 4130 and 4132 which are joined by a tab 4134 on outer surface 3624. In one embodiment, each of electrically conductive standoff 4130, electrically conductive standoff 4132, and tab 4134 are formed of a single piece of conductive material, e.g. metal.

Combinations of Features

Features described above may be combined in various ways without departing from the scope hereof. The following examples illustrate some possible combinations.

(A1) An inductor includes (1) a magnetic core including opposing first and second outer surfaces separated from each other in a first direction and (2) a first winding being wound around at least a portion of the magnetic core. A first end of the first winding is shaped to form a first electrically conductive standoff extending along the magnetic core in the first direction from the first outer surface to the second outer surface. A second end of the first winding is shaped to form a second electrically conductive standoff extending along the magnetic core in the first direction from the first outer surface to the second outer surface.

(A2) In the inductor denoted as (A1), each of the first and second electrically conductive standoffs may extend beyond the first outer surface in the first direction.

(A3) In any one of the inductors denoted as (A1) and (A2), each of the first and second electrically conductive standoffs may extend beyond the second outer surface in the first direction.

(A4) In any one of the inductors denoted as (A1) through (A3), each of the first and second electrically conductive standoffs may form a respective tab on the first outer surface.

(A5) In any one of the inductors denoted as (A1) through (A4), each of the first and second electrically conductive standoffs may form a respective tab on the second outer surface.

(A6) Any one of the inductors denoted as (A1) through (A5) may further include a third electrically conductive standoff extending along the magnetic core in the first direction from the first outer surface to the second outer surface.

(A7) Any one of the inductors denoted as (A1) through (A5) may further include (1) a second winding wound around at least a portion of the magnetic core (2) a third electrically conductive standoff connected to the second winding, the third electrically conductive standoff extending along the magnetic core in the first direction from the first outer surface to the second outer surface.

(A8) In the inductor denoted as (A7), the third electrically conductive standoff may extend beyond the first outer surface in the first direction.

(B1) A coupled inductor includes (1) a magnetic core including opposing first and second outer surfaces separated from each other in a first direction and (2) a plurality of windings, each winding of the plurality of windings being wound around at least a portion of the magnetic core. Each end of each winding of the plurality of windings is shaped to form an electrically conductive standoff extending along the magnetic core in the first direction from the first outer surface to the second outer surface.

(B2) In the coupled inductor denoted as (B1), each electrically conductive standoff may extend beyond the first outer surface in the first direction.

(B3) In any one of the coupled inductors denoted as (B1) and (B2), each electrically conductive standoff may extend beyond the second outer surface in the first direction.

(B4) In any one of the coupled inductors denoted as (B1) through (B3), each electrically conductive standoff may form a respective tab on the first outer surface.

(B5) In any one of the coupled inductors denoted as (B1) through (B4), each electrically conductive standoff may form a respective tab on the second outer surface.

(B6) Any one of the coupled inductors denoted as (B1) through (B5) may further include an additional electrically conductive standoff extending along the magnetic core in the first direction from the first outer surface to the second outer surface.

(B7) In the coupled inductor denoted as (B6), the additional electrically conductive standoff may form respective tabs on the first and second outer surfaces.

(C1) A circuit assembly includes (1) a first substrate, (2) a second substrate separated from the first substrate in a first direction, and (3) an inductor disposed between the first and second substrates in the first direction. The inductor includes a magnetic core and a first winding. The first winding is wound around at least a portion of the magnetic core. The first end of the first winding is shaped to form a first electrically conductive standoff, and the first electrically conductive standoff extends in the first direction from the first substrate to the second substrate. A second end of the first winding is shaped to form a second electrically conductive standoff, and the second electrically conductive standoff extends in the first direction from the first substrate to the second substrate.

(C2) In the circuit assembly denoted as (C1), (1) the magnetic core may be separated from the first substrate in the first direction by a first separation distance, (2) the first electrically conductive standoff may bridge the first separation distance, (3) the magnetic core may be separated from the second substrate in the first direction by a second separation distance, and (4) the first electrically conductive standoff may bridge the second separation distance.

(C3) In any one of the circuit assemblies denoted as (C1) and (C2), the first and second electrically conductive standoffs may mechanically support at least one of the first and second substrates.

(C4) In any one of the circuit assemblies denoted as (C1) through (C3), the first and second electrically conductive standoffs may mechanically join the first and second substrates.

(C5) In any one of the circuit assemblies denoted as (C1) through (C4), the first and second electrically conductive standoffs may electrically couple the first and second substrates.

Changes may be made in the above inductors and systems without departing from the scope hereof. It should thus be noted that the matter contained in the above description and shown in the accompanying drawings should be interpreted as illustrative and not in a limiting sense. The following claims are intended to cover generic and specific features described herein, as well as all statements of the scope of the present method and system, which, as a matter of language, might be said to fall therebetween.

What is claimed is:

1. An inductor, comprising:
    a magnetic core including opposing first and second outer surfaces separated from each other in a first direction; and
    a first winding being wound around at least a portion of the magnetic core, wherein:
        a first end of the first winding is shaped to form a first electrically conductive standoff extending along the magnetic core in the first direction from the first outer surface to the second outer surface,
        a second end of the first winding is shaped to form a second electrically conductive standoff extending along the magnetic core in the first direction from the first outer surface to the second outer surface,
        each of the first and second electrically conductive standoffs extends beyond the first outer surface in the first direction by a first distance, and
        each of the first and second electrically conductive standoffs extends beyond the second outer surface in the first direction by a second distance that has a smaller magnitude than the first distance.

2. The inductor of claim 1, wherein each of the first and second electrically conductive standoffs forms a respective tab that is separated from the first outer surface in the first direction.

3. The inductor of claim 2, wherein each of the first and second electrically conductive standoffs forms a respective tab on the second outer surface.

4. The inductor of claim 1, further comprising a third electrically conductive standoff extending along the magnetic core in the first direction from the first outer surface to the second outer surface.

5. The inductor of claim 1, further comprising:
    a second winding wound around at least a portion of the magnetic core; and
    a third electrically conductive standoff connected to the second winding, the third electrically conductive standoff extending along the magnetic core in the first direction from the first outer surface to the second outer surface.

6. The inductor of claim 5, wherein the third electrically conductive standoff extends beyond the first outer surface in the first direction.

7. A coupled inductor, comprising:
    a magnetic core including opposing first and second outer surfaces separated from each other in a first direction; and
    a plurality of windings, each winding of the plurality of windings being wound around at least a portion of the magnetic core;
    wherein:
        each end of each winding of the plurality of windings is shaped to form a respective electrically conductive standoff extending along the magnetic core in the first direction from the first outer surface to the second outer surface,
        each electrically conductive standoff extends beyond the first outer surface in the first direction by a first distance, and
        each electrically conductive standoff extends beyond the second outer surface in the first direction by a second distance that has a smaller magnitude than the first distance.

8. The coupled inductor of claim 7, wherein each electrically conductive standoff forms a respective tab that is separated from the first outer surface in the first direction.

9. The coupled inductor of claim 8, wherein each electrically conductive standoff forms a respective tab on the second outer surface.

10. The coupled inductor of claim 7, further comprising an additional electrically conductive standoff extending along the magnetic core in the first direction from the first outer surface to the second outer surface.

11. The coupled inductor of claim 10, wherein the additional electrically conductive standoff forms respective tabs on the first and second outer surfaces.

* * * * *